(12) United States Patent
Chen et al.

(10) Patent No.: US 9,219,197 B1
(45) Date of Patent: Dec. 22, 2015

(54) MICRO-LIGHT-EMITTING DIODE

(71) Applicant: MIKRO MESA TECHNOLOGY CO., LTD., Apia (WS)

(72) Inventors: Li-Yi Chen, Tainan (TW); Pei-Yu Chang, Tainan (TW); Chih-Hui Chan, Tainan (TW); Chun-Yi Chang, Tainan (TW); Shih-Chyn Lin, Tainan (TW); Hsin-Wei Lee, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 14/718,106

(22) Filed: May 21, 2015

Related U.S. Application Data

(63) Continuation-in-part of application No. 14/290,999, filed on May 30, 2014, now Pat. No. 9,105,813.

(51) Int. Cl.
*H01L 21/00* (2006.01)
*H01L 33/38* (2010.01)
*H01L 33/44* (2010.01)

(52) U.S. Cl.
CPC ............ *H01L 33/38* (2013.01); *H01L 33/44* (2013.01)

(58) Field of Classification Search
CPC .......... H01L 33/38; H01L 33/20; H01L 33/44
See application file for complete search history.

(56) References Cited

U.S. PATENT DOCUMENTS

| 6,410,492 B1 * | 6/2002 | Shimomura et al. ........... 508/485 |
| 2006/0169993 A1 * | 8/2006 | Fan et al. ......................... 257/88 |
| 2013/0126081 A1 * | 5/2013 | Hu et al. ........................ 156/249 |

* cited by examiner

*Primary Examiner* — Richard Booth
(74) *Attorney, Agent, or Firm* — CKC & Partners Co., Ltd.

(57) ABSTRACT

A micro-light-emitting diode (micro-LED) includes a first type semiconductor layer, a second type semiconductor layer, a first edge isolation structure, a first electrode, and a second electrode. The second type semiconductor layer and the first edge isolation structure are joined with the first type semiconductor layer. The first electrode is electrically coupled with the first type semiconductor layer. At least a part of a vertical projection of an edge of the first type semiconductor layer on the first electrode overlaps with the first electrode. The first edge isolation structure is at least partially located on the part of the first type semiconductor layer. The second electrode is electrically coupled with the second type semiconductor layer.

29 Claims, 22 Drawing Sheets

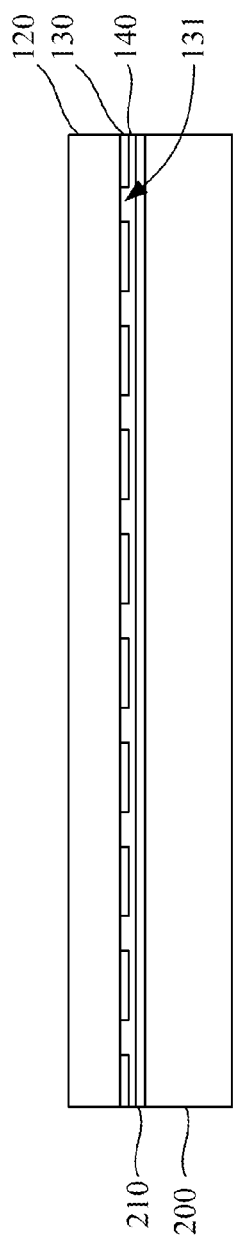
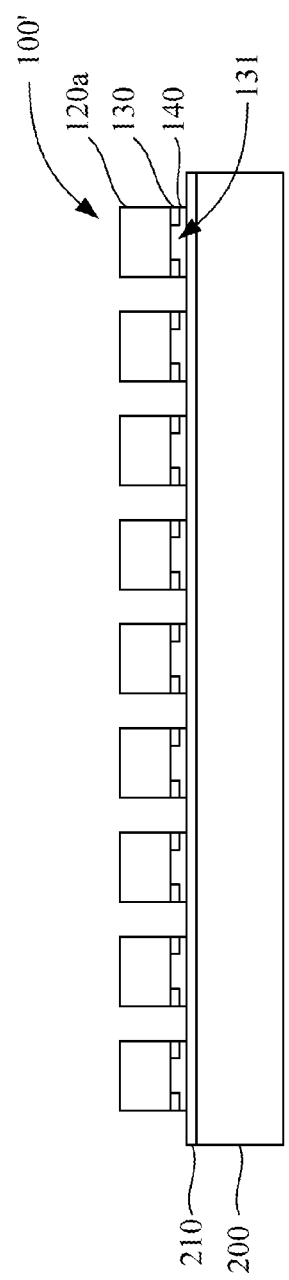

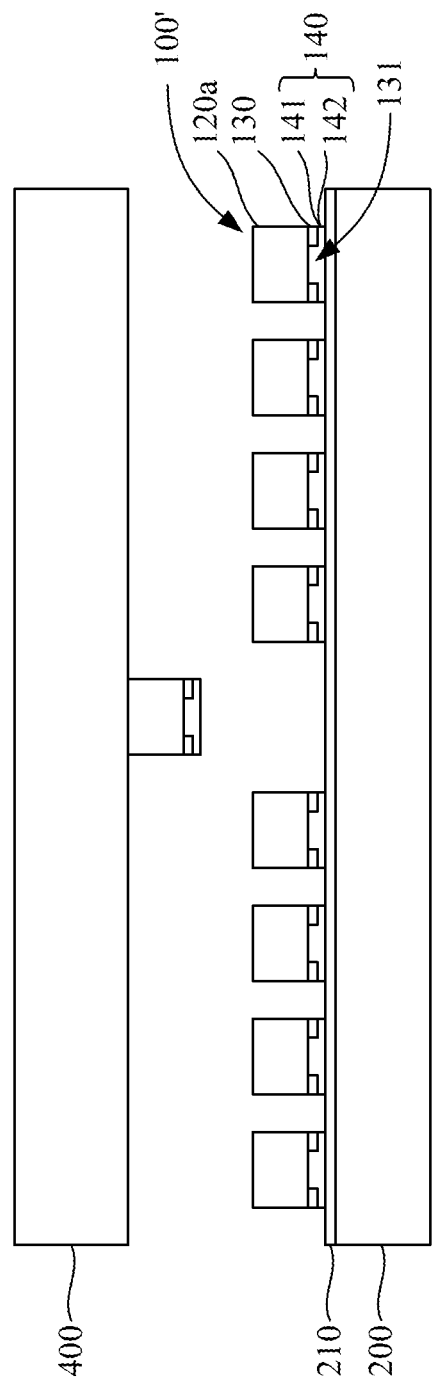

MICRO-LIGHT-EMITTING DIODE

RELATED APPLICATIONS

The present application is a continuation-in-part of U.S. application Ser. No. 14/290,999, filed May 30, 2014, which is herein incorporated by reference.

BACKGROUND

1. Technical Field

The present disclosure relates to micro-light-emitting diodes (micro-LEDs).

2. Description of Related Art

In the recent years, light-emitting diodes (LEDs) have become popular in general and commercial lighting applications. As light sources, LEDs have many advantages including lower energy consumption, longer lifetime, smaller size, and faster switching, and hence conventional lighting, such as incandescent lighting, is gradually replaced by LED lights. In an LED, when electrons and holes recombine across the semiconductor gap, the recombination energy is emitted in the form of photons and generates light. This recombination mechanism is the so-called radiative recombination.

An LED display which uses micro size LED arrays to control the current flow and maintain the efficiency and uniformity of the display is important.

SUMMARY

According to one embodiment of this invention, a micro-light-emitting diode (micro-LED) includes a first type semiconductor layer, a second type semiconductor layer, a first edge isolation structure, a first electrode, and a second electrode. The second type semiconductor layer and the first edge isolation structure are joined with the first type semiconductor layer. The first electrode is electrically coupled with the first type semiconductor layer. At least a part of a vertical projection of an edge of the first type semiconductor layer on the first electrode overlaps with the first electrode. The first edge isolation structure is at least partially located on the part of the first type semiconductor layer. The second electrode is electrically coupled with the second type semiconductor layer. At least one of the first electrode and the second electrode is at least partially transparent.

In an embodiment of the invention, the vertical projection of the edge of the first type semiconductor layer on the first electrode wholly overlaps with the first electrode, and the first edge isolation structure is at least partially located on the vertical projection of the first type semiconductor layer.

In an embodiment of the invention, the vertical projection of the edge of the first type semiconductor layer on the first electrode wholly overlaps with the first electrode, and the first edge isolation structure is wholly located on the vertical projection of the first type semiconductor layer.

In an embodiment of the invention, the first edge isolation structure is a dielectric layer.

In an embodiment of the invention, the first type semiconductor layer and the second type semiconductor layer form a first p-n junction. The first edge isolation structure and the first type semiconductor layer form a second p-n junction. The first electrode and the second electrode are configured to forward bias the first p-n junction while reverse bias the second p-n junction.

In an embodiment of the invention, the first type semiconductor layer is a p type semiconductor layer, and the second type semiconductor layer and the first edge isolation structure are n type semiconductor layers.

In an embodiment of the invention, the first type semiconductor layer is an n type semiconductor layer, and the second type semiconductor layer and the first edge isolation structure are p type semiconductor layers.

In an embodiment of the invention, the first type semiconductor layer and the second type semiconductor layer form a p-n junction, and the first edge isolation structure and the first type semiconductor layer form a Schottky barrier.

In an embodiment of the invention, the first edge isolation structure is a plasma-treated portion of the first type semiconductor layer.

In an embodiment of the invention, the first type semiconductor layer has a resistivity $\rho_1$, the first edge isolation structure layer is a high resistivity layer which has a resistivity $\rho_h$, and $\rho_h > \rho_1$.

In an embodiment of the invention, the first edge isolation structure is an electron blocking layer, and the first type semiconductor layer is an n type semiconductor layer.

In an embodiment of the invention, the first edge isolation structure is a hole blocking layer, and the first type semiconductor layer is a p type semiconductor layer.

In an embodiment of the invention, a micro-LED display includes a substrate and at least one micro-LED. The substrate has a bonding electrode. A combination of the first type semiconductor layer, the second type semiconductor layer, the first edge isolation structure, the first electrode, and the second electrode is joined with the bonding electrode. The first type semiconductor layer is proximal to the substrate, and the second type semiconductor layer is distal to the substrate.

In an embodiment of the invention, a micro-LED display includes a substrate and at least one micro-LED. A combination of the first type semiconductor layer, the second type semiconductor layer, the first edge isolation structure, the first electrode, and the second electrode is joined with the substrate. The first type semiconductor layer is proximal to the substrate. The second type semiconductor layer is distal to the substrate. The first electrode serves as a bonding electrode of the substrate.

In an embodiment of the invention, a micro-LED display includes a substrate and the micro-LED. The substrate has a bonding electrode. A combination of the first type semiconductor layer, the second type semiconductor layer, the first edge isolation structure, the first electrode, and the second electrode is joined with the bonding electrode. The first type semiconductor layer is distal to the substrate, and the second type semiconductor layer is proximal to the substrate.

In an embodiment of the invention, a micro-LED display includes a substrate and at least one micro-LED. A combination of the first type semiconductor layer, the second type semiconductor layer, the first edge isolation structure, the first electrode, and the second electrode is joined with the substrate. The first type semiconductor layer is distal to the substrate. The second type semiconductor layer is proximal to the substrate. The second electrode serves as a bonding electrode of the substrate.

In an embodiment of the invention, said one of the first electrode and the second electrode is wholly transparent.

In an embodiment of the invention, the first electrode is electrically coupled with the first type semiconductor layer through at least one passage of the first edge isolation structure formed between the first type semiconductor layer and the first electrode.

In an embodiment of the invention, current spreading length of lateral direction is proportional to $$\sqrt{\frac{t}{\rho}}.$$

The first type semiconductor layer has a resistivity $\rho_1$ and a thickness $t_1$, the second type semiconductor layer has a resistivity $\rho_2$ and a thickness $t_2$, and $$\sqrt{\frac{t_1}{\rho_1}} < \sqrt{\frac{t_2}{\rho_2}}.$$

In an embodiment of the invention, the micro-LED further includes a second edge isolation structure. The second edge isolation structure is joined with the second type semiconductor layer. The second electrode extends through at least one passage of the second edge isolation structure formed between the second type semiconductor layer and the second electrode to be electrically coupled with the second type semiconductor layer.

In an embodiment of the invention, the first electrode at least partially covers the exposed part of the first type semiconductor layer through the passage of the first edge isolation structure.

In an embodiment of the invention, the second electrode at least partially contacts the second type semiconductor layer.

In an embodiment of the invention, the first electrode at least partially contacts the first type semiconductor layer.

In an embodiment of the invention, the micro-LED further includes an active layer. The active layer is disposed between the first type semiconductor layer and the second type semiconductor layer. The first edge isolation structure is disposed between at least a part of the first type semiconductor layer and the active layer.

In an embodiment of the invention, the first edge isolation structure contacts the active layer.

In an embodiment of the invention, the first edge isolation structure is disposed in the first type semiconductor layer without contacting the active layer.

In an embodiment of the invention, the micro-LED further includes a second edge isolation structure. The second edge isolation structure is disposed between at least a part of the second type semiconductor layer and the active layer.

In an embodiment of the invention, the micro-LED further includes a second edge isolation structure. The second edge isolation structure is joined with the second type semiconductor layer. The second electrode extends through at least one passage of the second edge isolation structure formed between the second type semiconductor layer and the second electrode to be electrically coupled with the second type semiconductor layer.

In an embodiment of the invention, the passage of the first edge isolation structure is in the form of an opening.

The passage of the first edge isolation structure can lead most of the current flow into a certain area of the active layer. When the micro-LED is forward biased, charge carriers flow from the passage to the junction of the first type semiconductor layer and the second type semiconductor layer. Since the first edge isolation structure isolates at least a part of the edge of the micro-LED, charge carriers spreading to the side surface of the micro-LED are rare or none. Therefore, the non-radiative recombination occurring at the side surface of the micro-LED can be reduced, thereby increasing the efficiency of the micro-LED.

Moreover, since the first edge isolation structure limits charge carriers spreading to the side surface of the micro-LED to be rare or none, the leakage currents of the micro-LED can be reduced regardless of the lattice defects in the side surface of the micro-LED, which is helpful for continue miniaturization of the micro-LED.

BRIEF DESCRIPTION OF THE DRAWINGS

FIG. 2G is a cross-sectional side view illustration of removing the growth substrate from the bonded structure in FIG. 2F and thinning-down the p-n diode layer according to an embodiment of the invention;

FIG. 2H is a cross-sectional side view illustration of etching the p-n diode layer and the first conductive layer in FIG. 2G to form micro p-n diodes according to an embodiment of the invention;

FIG. 2I is a cross-sectional side view illustration of a transfer head picking up a micro-LED from the carrier substrate in FIG. 2H according to an embodiment of the invention;

DETAILED DESCRIPTION

Figure 1:
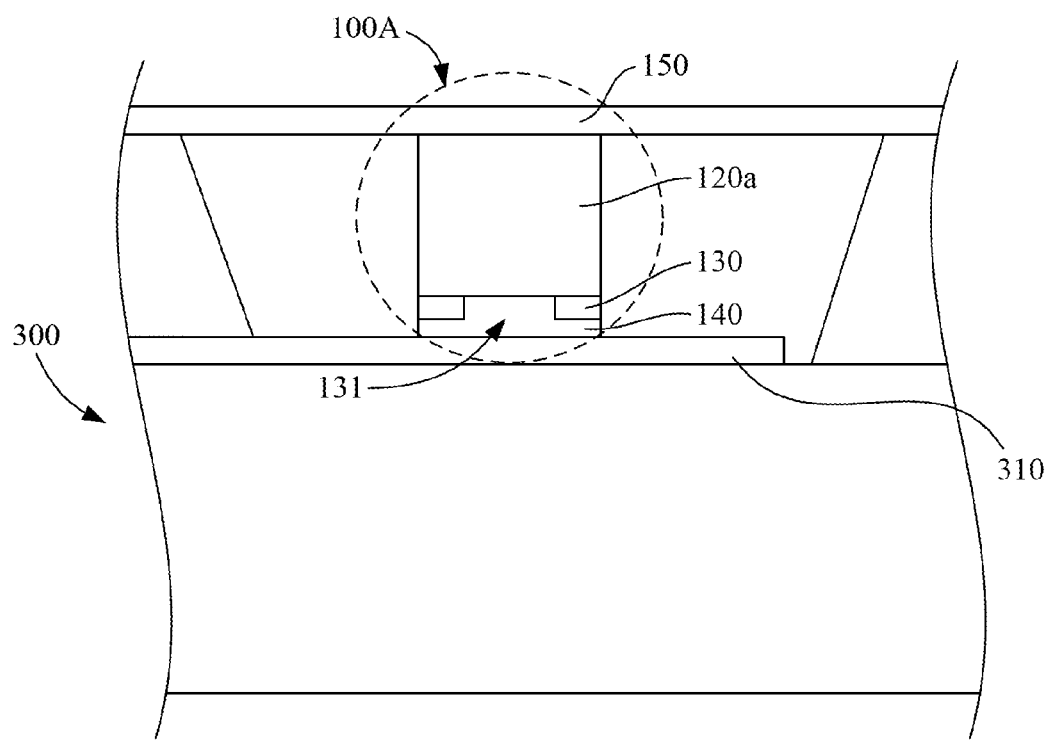
FIG. 1 is a cross-sectional view of a micro-light-emitting diode (micro-LED) disposed on a receiving substrate according to an embodiment of this invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present invention describe micro semiconductor devices and a method of forming an array of micro semiconductor devices such as micro-light-emitting diodes (micro-LEDs) for transfer to a receiving substrate. For example, the receiving substrate may be, but is not limited to, a display substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "micro" device, "micro" p-n diode or "micro" LED structure as used herein may refer to the descriptive size of certain devices or structures according to embodiments of the invention. As used herein, the terms "micro" devices or structures are meant to refer to the scale of 1 to 100 μm. However, it is to be appreciated that embodiments of the present invention are not necessarily so limited, and that certain aspects of the embodiments may be applicable to larger, and possibly smaller size scales.

Some embodiments of the invention describe a method of processing a bulk LED substrate into an array of micro-LEDs which are poised for pick up and transfer to a receiving substrate. In this manner, it is possible to integrate and assemble micro-LEDs into heterogeneously integrated systems. The micro-LEDs can be picked up and transferred individually, in groups, or as the entire array. Thus, the micro-LEDs in the array of micro-LEDs are poised for pick up and transfer to a receiving substrate such as display substrate of any size ranging from micro displays to large area displays, and at high transfer rates. In some embodiments, arrays of micro-LEDs which are poised for transfer are described as having a fine pitch and each micro LED has a regular octagon shape with the pitch size of 10 um. Thus a 4-inch LED epi wafer could be divided into an micro LED array which contains more than 27 million devices. Thus, a high density of pre-fabricated micro devices with a specific functionality may be produced in a manner in which they are poised for pick up and transfer to a receiving substrate.

FIG. 1 is a cross-sectional view of a micro-light-emitting diode (micro-LED) 100A disposed on a receiving substrate 300 according to an embodiment of this invention. The receiving substrate 300 is illustrated as a display substrate including a bonding electrode 310 joined with the micro-LED 100A, for example, and the details of the receiving substrate 300 can be referred to FIG. 10 and will be described in more detail in the following description. The micro-LED 100A includes a micro p-n diodes 120a, an edge isolation structure 130, a first conductive layer 140, and a second conductive layer 150. The micro-LED 100A shown in FIG. 1 can be manufactured according to operations sequentially illustrated by FIG. 2C-2I, for example.

Figure 2A:
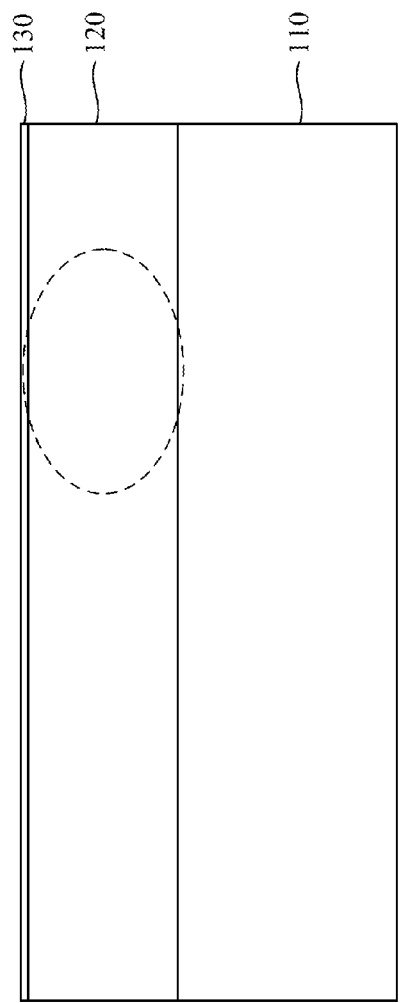
FIG. 2A is a cross-sectional side view illustration of a bulk LED substrate according to an embodiment of the invention.

FIG. 2A is a cross-sectional side view illustration of a bulk LED substrate according to an embodiment of the invention. Referring now to FIG. 2A, a semiconductor device layer 120 is formed on a growth substrate 110. In an embodiment, the semiconductor device layer 120 may not be fully functionalized. For example, contacts such as an anode or cathode may not yet be formed. In the interest of conciseness and to not obscure embodiments of the invention, the following description is made with regard to the semiconductor device layer 120 as a p-n diode layer 120 grown on the growth substrate 110 according to conventional heterogeneous growth conditions.

The p-n diode layer 120 may include a compound semiconductor having a bandgap corresponding to a specific region in the spectrum. For example, the p-n diode layer 120 may include one or more layers based on II-VI materials (e.g. ZnSe, ZnO) or Ill-V nitride materials (e.g. GaN, AlN, InN, InGaN, GaP, AlInGaP, AlGaAs and their alloys). The growth substrate 110 may include any suitable substrate such as, but not limited to, silicon, SiC, GaAs, GaN and sapphire ($Al_2O_3$).

In a particular embodiment, the growth substrate 110 is sapphire, and the p-n diode layer 120 is formed of GaN. Despite the fact that sapphire has a larger lattice constant and thermal expansion coefficient mismatch with respect to GaN, sapphire is reasonably low cost, widely available and its transparency is compatible with laser lift-off (LLO) techniques. In another embodiment, another material such as SiC may be used as the growth substrate 110 for the GaN p-n diode layer 120. Like sapphire, SiC substrates may be transparent. Several growth techniques may be used for growth of the p-n diode layer 120 such as metalorganic chemical vapor deposition (MOCVD).

Figure 2B:
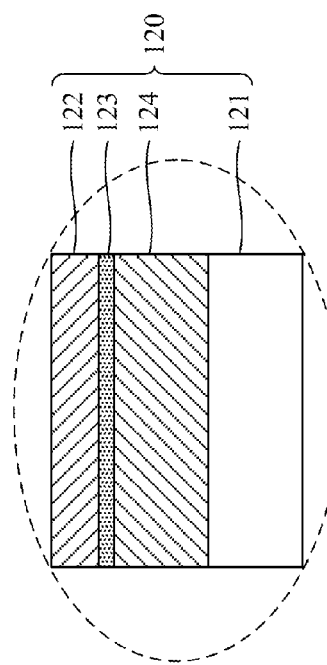
FIG. 2B is an enlarged section of the p-n diode layer in FIG. 2A.

FIG. 2B is an enlarged section of the p-n diode layer 120 in FIG. 2A. In the particular embodiment illustrated in FIG. 2B, the p-n diode layer 120 may include a first type semiconductor layer 122 (e.g., a p-doped layer), an active layer 123, a second type semiconductor layer 124 (e.g., an n-doped layer), and a buffer bulk GaN layer 121. In some embodiments, the buffer bulk GaN layer 121 is optionally not formed in the p-n diode layer 120, so the following operation of removing the buffer bulk GaN layer 121 (i.e., the operation illustrated in FIG. 2G) can be omitted. The buffer bulk GaN layer 121 may be n-doped due to silicon or oxygen contamination, or intentionally doped with a donor such as silicon. The second type semiconductor layer 124 may likewise be doped with a donor such as silicon, while first type semiconductor layer 122 may be doped with an acceptor such as magnesium. A variety of alternative p-n diode configurations may be utilized to form the p-n diode layer 120. Likewise, a simple p-n contact junction or a variety of single quantum well (SQW) or multiple quantum well (MQW) configurations may be utilized to form the active layer 123. In addition, various buffer layers may be included as appropriate. In one embodiment, the sapphire growth substrate 110 has a thickness of approximately 100 µm-400 µm, the buffer bulk GaN layer 121 has a thickness of approximately 3 µm-5 µm, the second type semiconductor layer 124 has a thickness of approximately 0.1 µm-5 µm, the active layer 123 has a thickness less than approximately 100-400 nm, and the first type semiconductor layer 122 has a thickness of approximately 100 nm-1 µm.

Figure 2C:
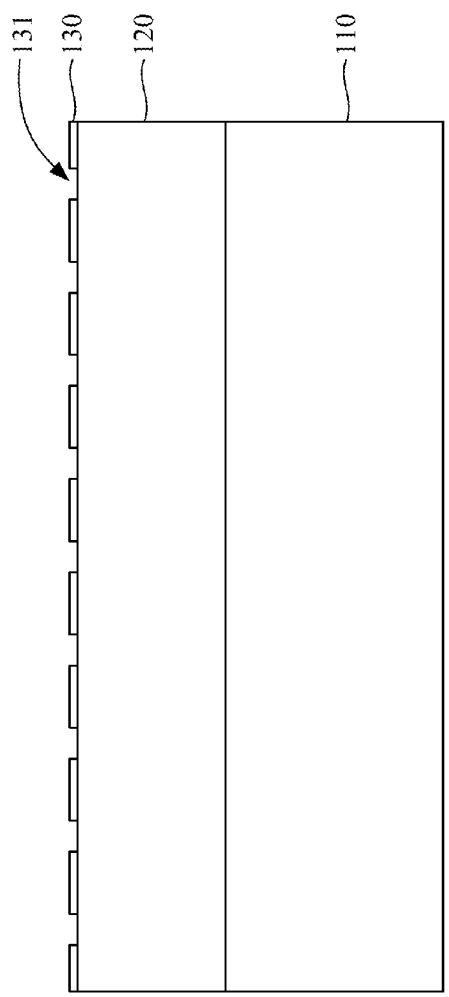
FIG. 2C is a cross-sectional side view illustration of a patterned edge isolation structure formed on the p-n diode layer in FIG. 2A according to an embodiment of the invention.

FIG. 2C is a cross-sectional side view illustration of a patterned edge isolation structure 130 formed on the p-n diode layer 120 in FIG. 2A according to an embodiment of the invention. Referring now to FIG. 2C, an edge isolation structure 130 may then be formed over the p-n diode layer 120, and a plurality of passage 131 are formed within the edge isolation structure 130. In the embodiment of the invention, after a plurality of the micro-LEDs 100A are manufactured (as described in the following description), each of the micro-LEDs 100A has one passage 131, but the invention is not limited in this regard. In some embodiments, after a plurality of the micro-LEDs 100A are manufactured, each of the micro-LEDs 100A may have more than one passage 131.

Figure 2D:
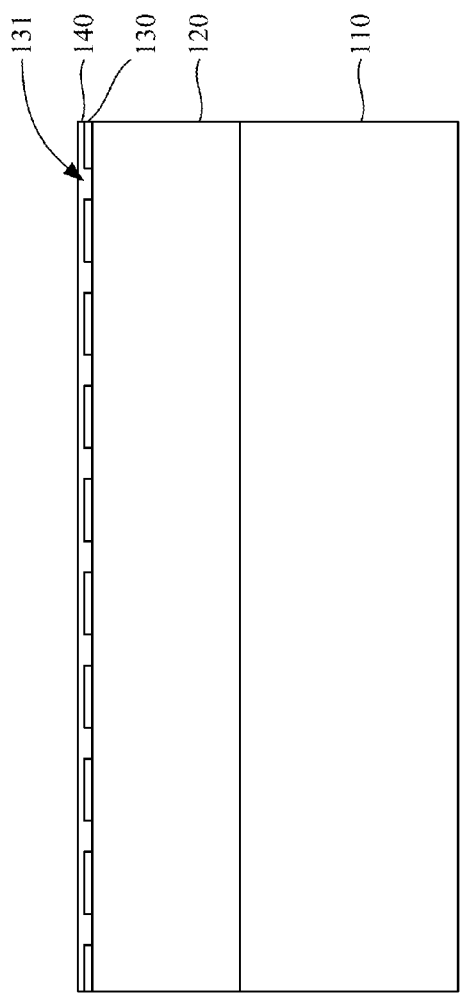
FIG. 2D is a cross-sectional side view illustration of a first conductive layer formed on the patterned edge isolation structure in FIG. 2C according to an embodiment of the invention.

FIG. 2D is a cross-sectional side view illustration of a first conductive layer 140 formed on the patterned edge isolation structure 130 in FIG. 2C according to an embodiment of the invention. Referring now to FIG. 2D, a first conductive layer 140 may then be formed over the edge isolation structure 130. The first conductive layer 140 is electrically coupled with the exposed parts of the first type semiconductor layer 122 of the p-n diode layer 120 through the passage 131. The first conductive layer 140 serves as an electrode layer, though other layers may be included. In an embodiment, the first conductive layer 140 has a thickness of approximately 0.1 µm-15 µm. In another embodiment, the first conductive layer 140 may also be optically transparent. Transparency may be accomplished by making the first conductive layer 140 very thin to minimize light absorption or using the transparent conductive materials. Alternatively, in some embodiments, the first conductive layer 140 is formed on the receiving substrate 300 in advance, rather than formed on the patterned edge isolation structure 130 (as illustrated in FIG. 2D).

Figure 2E:
FIG. 2E is a cross-sectional side view illustration of a carrier substrate with an adhesive layer according to an embodiment of the invention.
Figure 2F:
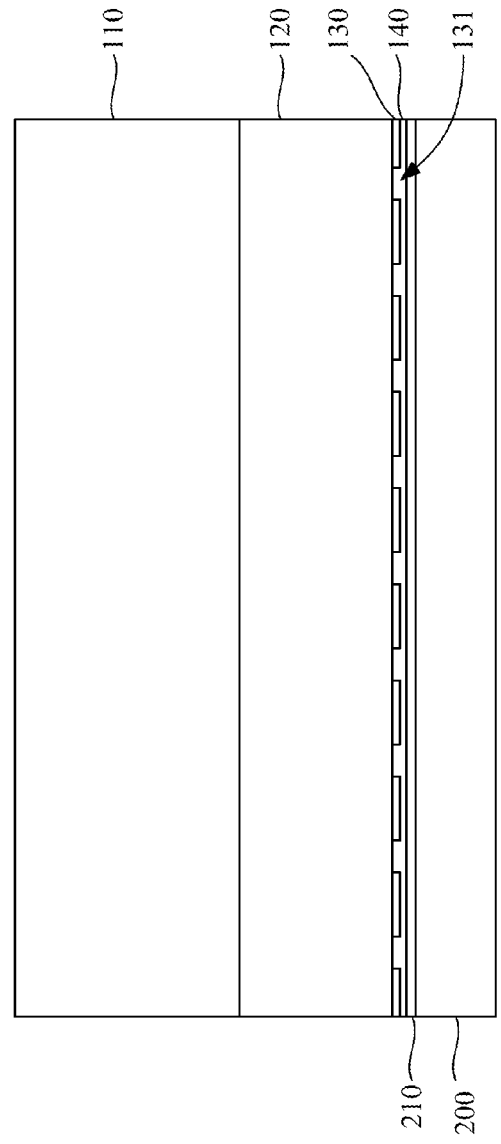
FIG. 2F is a cross-sectional side view illustration of bonding the structure of FIG. 2D and the structure of FIG. 2E together according to an embodiment of the invention.

FIG. 2E is a cross-sectional side view illustration of a carrier substrate with an adhesive layer 210 according to an embodiment of the invention. FIG. 2F is a cross-sectional side view illustration of bonding the structure of FIG. 2D and the structure of FIG. 2E together according to an embodiment of the invention. According to certain embodiments of the invention, a combination of the p-n diode layer 120, the edge isolation structure 130, and the first conductive layer 140 grown on the growth substrate 110 is subsequently transferred to a carrier substrate 200 before chipped, such as one illustrated in FIG. 2F and described in more detail in the following description. In some embodiments, the first conductive layer 140 and the p-n diode layer 120 may be chipped prior to transfer to a carrier substrate 200. Accordingly, embodiments of the invention may be implemented in a multitude of variations during formation of an array of micro-LEDs 100A for subsequent transfer to the receiving substrate 300.

In an embodiment, the adhesive layer 210 may have a thickness of approximately 0.1 µm-100 µm.

The adhesive layer 210 may be made of adhesion capable organic or non-organic materials, e.g., UV curable glue or silicone. The adhesive layer 210 may be formed from a material which is capable of adhering the combination of the p-n diode layer 120, the edge isolation structure 130, and the first conductive layer 140 to the carrier substrate 200. Specifically, the adhesion force of the adhesive layer 210 could be adjusted or reduced by an electric field, UV light, electromagnetic radiation, heat, ultrasound, mechanical force, pressure, or any combinations thereof. Referring now to FIG. 2F, the combination of the p-n diode layer 120, the edge isolation structure 130, and the first conductive layer 140 and the carrier substrate 200 may be bonded together by using the adhesive layer 210.

FIG. 2G is a cross-sectional side view illustration of removing the growth substrate 110 from the bonded structure in FIG. 2F and thinning-down the p-n diode layer 120 according to an embodiment of the invention. Referring now to FIG. 2G, the growth substrate 110 has been removed from the bonded structure. The growth substrate 110 may be removed by a suitable method such as chemical lift-off or laser lift-off (LLO). While using LLO, the absorption in the GaN p-n diode layer 120 at the interface results in localized heating of the interface resulting in decomposition at the interfacial GaN to liquid Ga metal and nitrogen gas. Once the desired are has been irradiated, the transparent sapphire growth substrate 110 can be removed by remelting the Ga on a hotplate.

Referring now to FIG. 2G, the p-n diode layer 120 is then thinned down to a desirable thickness. Referring back to the enlarged p-n diode layer 120 in FIG. 2B, a predetermined amount of the buffer bulk GaN layer 121 (which may be n-type) or a portion of the second type semiconductor layer 124 are removed so that an operable p-n diode remains after thinning. The buffer bulk GaN layer 121 can be fully etched. Alternatively, the buffer bulk GaN layer 121 can be partially etched to form contact holes via which the second type semiconductor layer 124 can be electrically coupled with the second conductive layer 150 shown in FIG. 1. In some embodiments, the buffer bulk GaN layer 121 is optionally not formed in the p-n diode layer 120, so the operation of removing the buffer bulk GaN layer 121 (i.e., the operation illustrated in FIG. 2G) can be omitted. Depending upon the underlying structure, the thinning process may be optionally performed utilizing suitable techniques such as dry etching to etch the buffer bulk GaN layer 121.

FIG. 2H is a cross-sectional side view illustration of etching the p-n diode layer 120 and the first conductive layer 140 in FIG. 2G to form micro p-n diodes 120a according to an embodiment of the invention. Referring now to FIG. 2H, the plurality of micro p-n diodes 120a are positioned over the adhesive layer 210. In the embodiment, the micro p-n diodes 120a have vertical sidewalls. For example, ICP (Inductively Coupled Plasma) which a chlorine-based etch chemistry may be utilized to obtain vertical sidewalls.

FIG. 2I is a cross-sectional side view illustration of a transfer head 400 picking up a micro-LED 100' from the carrier substrate 200 in FIG. 2H according to an embodiment of the invention. Referring now to FIG. 2I, the micro-LEDs 100' or array of micro-LEDs 100' in FIG. 2I are poised for pick up and transfer to the receiving substrate 300 illustrated in FIG. 1, for example with a transfer head 400.

In some embodiments, the Young's modulus of the adhesive layer 210 is less than or equal to 30 GPa. As a result, the adhesive layer 210 may absorb impact forces associated with contacting the micro-LEDs 100' with a transfer head 400 during the pick up process.

Referring back to FIG. 2H, the carrier substrate 200 is provided having an array of micro-LEDs 100' disposed thereon. Each micro-LED 100' may at least include the micro p-n diode 120a, the edge isolation structure 130 having at least one passage 131, and the first conductive layer 140, with the first conductive layer 140 between the edge isolation structure 130 and the adhesive layer 210 on the carrier substrate 200. To transfer the micro-LED 100' to the receiving substrate 300 illustrated in FIG. 1, the adhesion force of the adhesive layer 210 is decreased by an electric field, UV light, electromagnetic radiation, heat, ultrasound, mechanical force, pressure, or any combinations thereof in advance. A combination of the micro p-n diode 120a, the edge isolation structure 130, the first conductive layer 140 is then be picked up with the transfer head 400 and then placed on the receiving substrate 300.

A variety of suitable transfer heads can be utilized to aid in the pick up and placement operations according to embodiments of the invention. For example, the transfer head 400 may exert a pick up pressure on the micro-LED 100' according to vacuum, magnetic, adhesive, or electrostatic attraction in order to pick up the micro-LED 100'.

Referring back to FIG. 1 which is an illustration of the receiving substrate 300 onto which a micro-LED 100A has been placed. In the embodiment, the receiving substrate 300 is a display substrate. In the particular embodiment illustrated, the micro-LED 100' shown in FIG. 2I may be placed over the bonding electrode 310 of the receiving substrate 300. A second conductive layer 150 may then be formed over the micro p-n diode 120a, so as to form the micro-LED 100A shown in FIG. 1. In some embodiments, the second conductive layer 150 is formed from a transparent contact material such as indium tin oxide (ITO). In some embodiments, the second conductive layer 150 is in the form of a bonding wire.

In one embodiment, the p-n diode 120a may include a second type semiconductor layer 124 with a thickness of approximately 0.1 µm-50 µm, the active layer 123 (which may be SQW or MQW) with a thickness approximately 50 nm-5 µm, and the first type semiconductor layer 122 with thickness of approximately 50 nm-20 µm. In an embodiment, the second type semiconductor layer 124 may be 0.1 µm-6 µm thick (which may include or replace buffer bulk layer 121 previously described).

Figure 3:
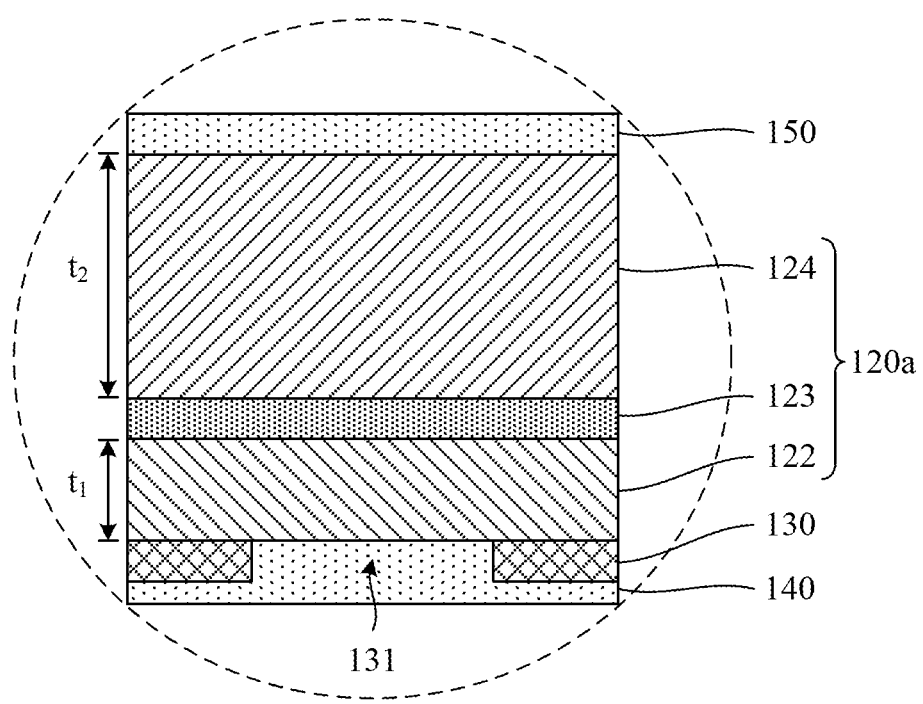
FIG. 3 is an enlarged cross-sectional view of the micro-LED in FIG. 1 according to a first embodiment of this invention.

FIG. 3 is an enlarged cross-sectional view of the micro-LED 100A in FIG. 1 according to a first embodiment of this invention. The micro-LED 100A includes a micro p-n diode 120a, an edge isolation structure 130, a first conductive layer 140, and a second conductive layer 150. The micro p-n diode 120a includes a first type semiconductor layer 122, an active layer 123, and a second type semiconductor layer 124. The second type semiconductor layer 124 is joined with the first type semiconductor layer 122. The active layer 123 is disposed between the first type semiconductor layer 122 and the second type semiconductor layer 124. The edge isolation structure 130 is joined with the first type semiconductor layer 122. The edge isolation structure 130 has at least one passage 131 formed between the first type semiconductor layer 122 and the first conductive layer 140. The first conductive layer 140 is partially joined with the edge isolation structure 130 and is electrically coupled with the first type semiconductor layer 122 through the passage 131 of the edge isolation structure 130. The second conductive layer 150 is electrically coupled with the second type semiconductor layer 124. At least one of the first conductive layer 140 and the second conductive layer 150 is at least partially transparent.

In the embodiment, the first conductive layer 140 wholly covers the exposed part of the first type semiconductor layer 122 through the passage 131 of the edge isolation structure 130, but the invention is not limited in this regard.

Referring to FIG. 1 and FIG. 3, in the embodiment, a combination of the first type semiconductor layer 122, the active layer 123, the second type semiconductor layer 124, the edge isolation structure 130, the first conductive layer 140, and the second conductive layer 150 is joined with the bonding electrode 310 on the receiving substrate 300, so as to form a micro-LED display. In the embodiment, the first type semiconductor layer 122 is proximal to the receiving substrate 300, the second type semiconductor layer 124 is distal to the receiving substrate 300, and the second conductive layer 150 is wholly transparent.

Figure 4A:
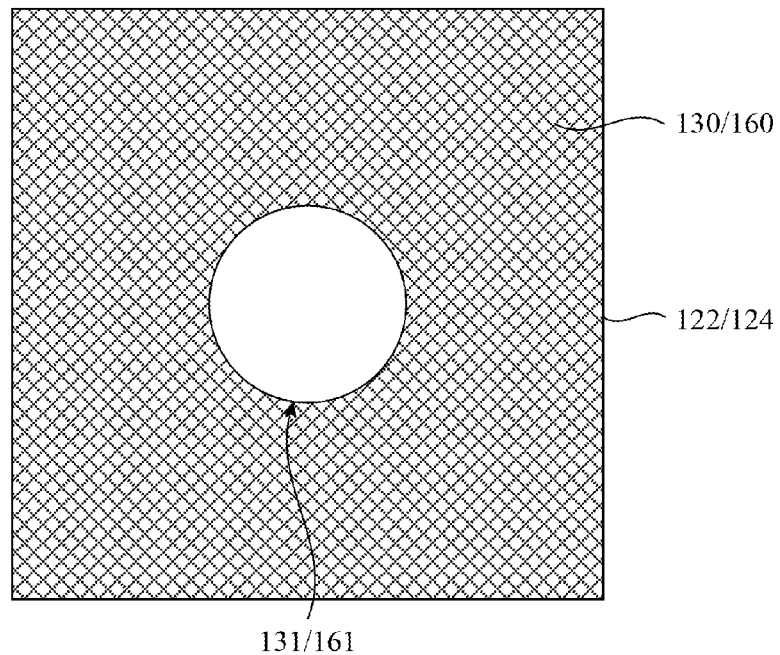
FIG. 4A is a plan view of an edge isolation structure according to an embodiment of this invention.

FIG. 4A is a plan view of an edge isolation structure 130 according to an embodiment of this invention. Referring now to FIG. 4A, in the embodiment, a vertical projection of an edge of the first type semiconductor layer 122 on the first conductive layer 140 wholly overlaps with the first conductive layer 140, and the edge isolation structure 130 is wholly located on the vertical projection of the edge of the first type semiconductor layer 122. That is, the edge isolation structure 130 of FIG. 4A wholly isolates between the edge of the first type semiconductor layer 122 and the first conductive layer 140, but the invention is not limited in this regard. In addition, the passage 131 of the edge isolation structure 130 of FIG. 4A is in the form of an opening, but the invention is not limited in this regard.

Figure 4B:
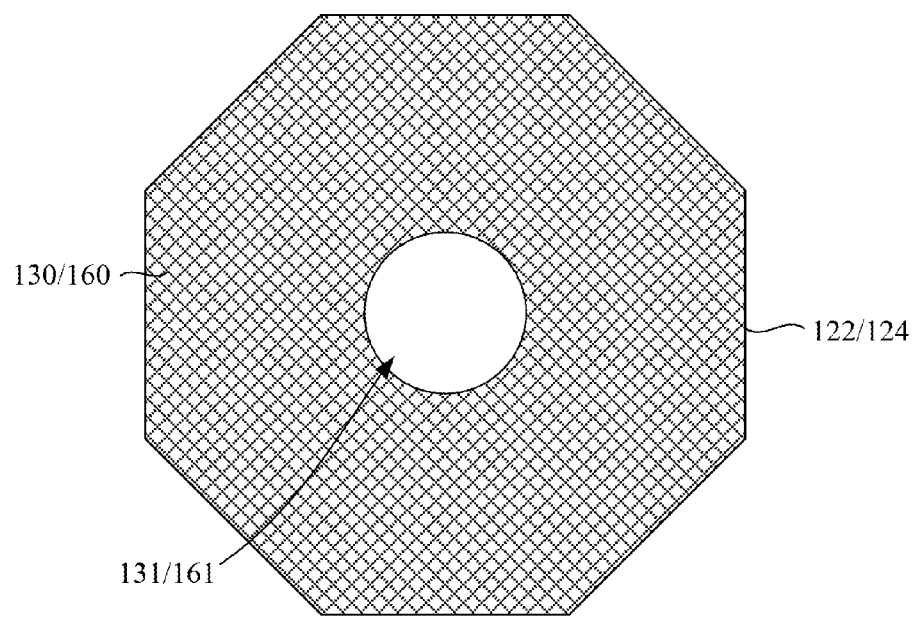
FIG. 4B is a plan view of an edge isolation structure according to another embodiment of this invention.

FIG. 4B is a plan view of an edge isolation structure 130 according to another embodiment of this invention. Referring now to FIG. 4B, in the embodiment, the edge isolation structure 130 is also wholly located on the vertical projection of the edge of the first type semiconductor layer 122. The difference between FIG. 4B and FIG. 4A is that the vertical projection of the edge of the first type semiconductor layer 122 in FIG. 4B is octagonal. Other details of FIG. 4B are similar to FIG. 4A and therefore are not repeated here to avoid duplicity.

Figure 4C:
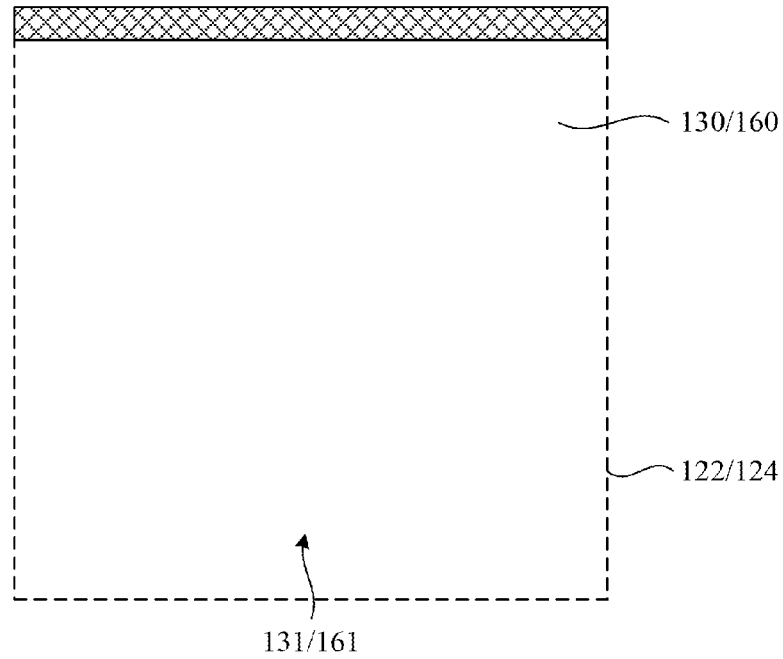
FIG. 4C is a plan view of an edge isolation structure according to another embodiment of this invention.

FIG. 4C is a plan view of an edge isolation structure 130 according to another embodiment of this invention. The difference between the edge isolation structure 130 of FIG. 4C and the edge isolation structure 130 of FIG. 4A is that the edge isolation structure 130 of FIG. 4C is partially located on the vertical projection of the edge of the first type semiconductor layer 122. That is, the edge isolation structure 130 of FIG. 4C partially isolates between the edge of the first type semiconductor layer 122 and the first conductive layer 140.

As shown in FIG. 3, the passage 131 of the edge isolation structure 130 defines the contact interface between the first conductive layer 140 and the first type semiconductor layer 122. When the micro-LED 100A is forward biased, charge carriers flow from the contact interface between the first conductive layer 140 and the first type semiconductor layer 122 to the junction of the first type semiconductor layer 122 and the second type semiconductor layer 124 (i.e., the active layer 123). Since the edge isolation structure 130 at least partially isolates between the edge of the first type semiconductor layer 122 and the first conductive layer 140, charge carriers spreading to the side surface of the micro-LED 100A are rare or none. Therefore, the non-radiative recombination occurring at the side surface of the micro-LED 100A can be reduced, thereby increasing the efficiency of the micro-LED 100A.

In some embodiments, the size of the micro-LED 100A is smaller than 250 μm×250 μm or 0.0625 mm².

Specifically, to reduce the non-radiative recombination occurring at the side surface of the micro-LED 100A, the micro-LED 100A having the edge isolation structure 130 generally comply with the inequality: L/A>L'/A', where L is the original perimeter of the edge of the first type semiconductor layer 122 viewed in a direction normal to the first type semiconductor layer 122, A is the original area of the first type semiconductor layer 122 viewed in the direction, L' is the perimeter of the part of the edge of the first type semiconductor layer 122 that is not covered by the edge isolation structure 130 viewed in the direction, and A' is the area of the part of the first type semiconductor layer 122 that is not covered by the edge isolation structure 130 viewed in the direction.

For example, the size of the first type semiconductor layer 122 of FIG. 4C is 100 μm×100 μm, and the size of the edge isolation structure 130 is 100 μm×3 μm. Therefore, the value of L/A=(100×4)/(100×100)=0.04, and the value of L'/A'=(100+97×2)/(100×97)=0.03 which is smaller than L/A. As a result, the edge isolation structure 130 in the micro-LED 100A of FIG. 4C complies with the above-mentioned inequality and thus can effectively reduce the non-radiative recombination occurring at the side surface of the micro-LED 100A.

Figure 4D:
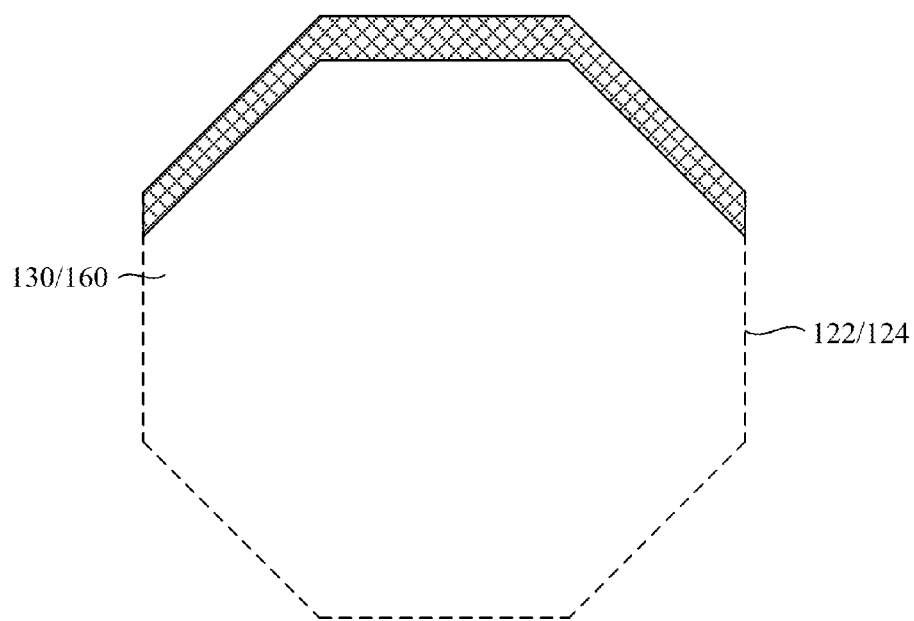
FIG. 4D is a plan view of an edge isolation structure according to another embodiment of this invention.

FIG. 4D is a plan view of an edge isolation structure 130 according to another embodiment of this invention. Referring now to FIG. 4D, in the embodiment, the edge isolation structure 130 is also partially located on the vertical projection of the edge of the first type semiconductor layer 122. The difference between FIG. 4D and FIG. 4C is that the vertical projection of the edge of the first type semiconductor layer 122 in FIG. 4D is octagonal. Other details of FIG. 4D are similar to FIG. 4C and therefore are not repeated here to avoid duplicity.

Figure 4E:
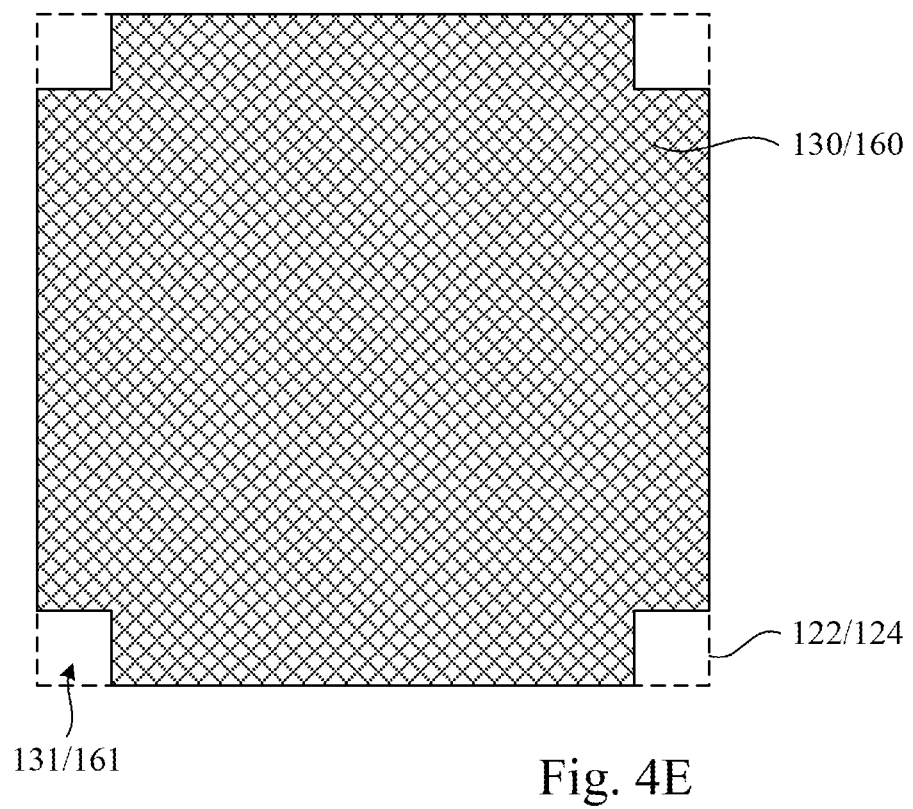
FIG. 4E is a plan view of an edge isolation structure according to another embodiment of this invention.

FIG. 4E is a plan view of an edge isolation structure 130 according to another embodiment of this invention. Similarly, the difference between the edge isolation structure 130 of FIG. 4E and the edge isolation structure 130 of FIG. 4A is that the edge isolation structure 130 of FIG. 4E is partially located on the vertical projection of the edge of the first type semiconductor layer 122. However, for example, the size of the first type semiconductor layer 122 of FIG. 4E is 100 μm×100 μm, and the edge isolation structure 130 covers the first type semiconductor layer 122 except four corners of which the size of each is 10 μm×10 μm. Therefore, the value of L'/A'=(10× 2×4)/(10×10×4)=0.2 which is larger than L/A. Under the circumstances, the edge isolation structure 130 in the micro-LED 100A of FIG. 4C violates the above-mentioned inequality and thus cannot reduce the non-radiative recombination occurring at the side surface of the micro-LED 100A.

In some embodiments, the current spreading length of the first type semiconductor layer 122 is less than the current spreading length of the second type semiconductor layer 124. In some embodiments, the current spreading length of the second type semiconductor layer 124 is over 20 times greater than the current spreading length of the first type semiconductor layer 122. In this configuration, charge carriers in the first type semiconductor layer 122 are more difficult to spread to the side surface of the first type semiconductor layer 122 and/or the side surface of the active layer 123. Therefore, the surface recombination and the leakage currents occurred at the side surface of the micro-LED 100A can be decreased.

The current spreading length of lateral direction of a semiconductor layer of a diode is determined by the following equation I:

$$L_s = \sqrt{\frac{tn_{ideal}KT}{\rho J_0 |e|}}, \quad \text{Equation I}$$

where $L_s$ is the current spreading length of the semiconductor layer of the diode, t is the thickness of the semiconductor layer, $n_{ideal}$ is the ideality factor of the diode, K is the Boltzmann constant, T is the temperature of the semiconductor layer in Kelvin, ρ is the resistivity of the semiconductor layer, $J_0$ is the current density at the interface between the semiconductor layer and an electrode of the diode, and e is the electric charge of an electron.

As confirmed by the aforementioned equation I, the current spreading length of the semiconductor layer of the diode is proportional to $$\sqrt{\frac{t}{\rho}}.$$

Therefore, in some embodiments, the first type semiconductor layer 122 has a resistivity $\rho_1$ and a thickness $t_1$, the second type semiconductor layer 124 has a resistivity $\rho_2$ and a thickness $t_2$, and $$\sqrt{\frac{t_1}{\rho_1}} < \sqrt{\frac{t_2}{\rho_2}}$$

to make the current spreading length of the first type semiconductor layer 122 to be less than the current spreading length of the second type semiconductor layer 124.

Since the first type semiconductor layer 122 has the short current spreading length, the first type semiconductor layer 122 for example has high resistivity and is thin in thickness, as illustrated in FIG. 3. Furthermore, since the edge isolation structure 130 accompanied with the first type semiconductor layer 122 having the short current spreading length limits carriers spreading to the side surface of the micro-LED 100A to be rare or none, the leakage currents of the micro-LED 100A can be reduced regardless of the lattice defects in the side surface of the micro-LED 100A, which is helpful for continue miniaturization of the micro-LED 100A.

In some embodiments, the first type semiconductor layer 122 is made of, for example, p-doped GaN or p-doped AlGaInP. The thickness of the first type semiconductor layer 122 is in a range from 50 nm to 20 µm. The first type semiconductor layer 122 is formed by, for example, epitaxy.

In some embodiments, the first type semiconductor layer 122 may include an optional ohm contact layer (not shown) to reduce the contact resistance between the first conductive layer 140 and the first type semiconductor layer 122. In some embodiments, the ohm contact layer and the rest of the first type semiconductor layer 122 are made of, for example, p-doped GaN or p-doped AlGaInP, while the ohm contact layer is doped more heavily than the rest of the first type semiconductor layer 122. Alternatively, the ohm contact layer is made of, for example, InGaN, and the rest of the first type semiconductor layer 122 is made of, for example, p-doped GaN or p-doped AlGaInP. The thickness of the ohm contact layer is in a range from 5 nm to 2 µm. The thickness of the rest of the first type semiconductor layer 122 is in a range from 50 nm to 20 µm.

In some embodiments, the second type semiconductor layer 124 is made of, for example, n-doped GaN:Si. The thickness of the second type semiconductor layer 124 is in a range from 0.1 µm to 50 µm. The second type semiconductor layer 124 is formed by, for example, epitaxy.

Similarly, in some embodiments, the second type semiconductor layer 124 also includes an optional ohm contact layer (not shown) to reduce the contact resistance between the second conductive layer 150 and the second type semiconductor layer 124. In some embodiments, the ohm contact layer and the rest of the second type semiconductor layer 124 are made of, for example, n-doped GaN:Si, while the ohm contact layer is doped more heavily than the rest of the second type semiconductor layer 124. The thickness of the ohm contact layer is in a range from 5 nm to 2 µm. The thickness of the rest of the second type semiconductor layer 124 is in a range from 0.1 µm to 50 µm.

In some embodiments, the active layer 123 is made of, for example, heterostructure or quantum well structure. The thickness of the active layer 123 is in a range from 50 nm to 5 µm. The active layer 123 is formed by, for example, epitaxy.

In some embodiments, the active layer 123 can be omitted. In the case that the active layer 123 is omitted, the second type semiconductor layer 124 is directly joined with the first type semiconductor layer 122.

The second conductive layer 150 of the micro-LED 100A shown in FIG. 3 is at least partially joined with the second type semiconductor layer 124, such that the first type semiconductor layer 122, the active layer 123, and the second type semiconductor layer 124 are disposed between the first conductive layer 140 and the second conductive layer 150. Both the first conductive layer 140 and the second conductive layer 150 are made of a conductive material, such as metal or a transparent conductive material, e.g., indium tin oxide (ITO). The first conductive layer 140 and the second conductive layer 150 can be formed by, for example, physical vapor deposition (PVD) or chemical vapor deposition (CVD).

In addition, the second conductive layer 150 in the embodiment fully contacts the second type semiconductor layer 124, but the invention is not limited in this regard. In some embodiments, the second conductive layer 150 is in the form of a bonding wire and partially contacts the second type semiconductor layer 124.

In some embodiments, a combination of the first type semiconductor layer 122, the active layer 123, the second type semiconductor layer 124, and the edge isolation structure 130 with the passage 131 is a solid with at least two planes. For example, the combination of the first type semiconductor layer 122, the active layer 123, the second type semiconductor layer 124, and the edge isolation structure 130 with the passage 131 is a cylinder, a polyhedron, or a trapezoidal solid.

In some embodiments, the edge isolation structure 130 is transparent. In some embodiments, the edge isolation structure 130 is monochrome transparent. In some embodiments, the edge isolation structure 130 is reflective. In some embodiments, the edge isolation structure 130 is monochrome reflective.

In some embodiments, the edge isolation structure 130 is a dielectric layer which is made of a dielectric material, such as silicon nitride or silicon dioxide. The thickness of the edge isolation structure 130 is in a range from 1 nm to 5 µm. The edge isolation structure 130 is formed by, for example, physical vapor deposition (PVD), CVD. However, the edge isolation structure 130 of the invention is not limited to be a dielectric layer.

Figure 5A:
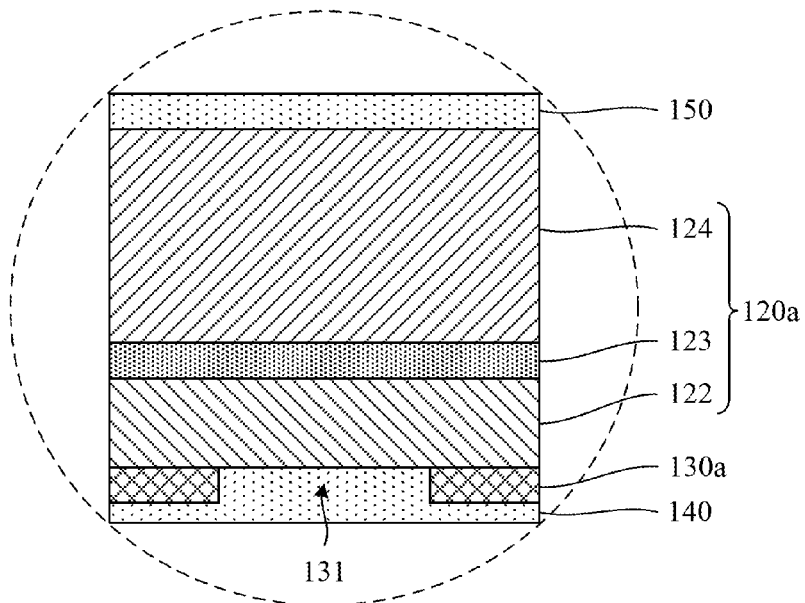
FIG. 5A is an enlarged cross-sectional view of the micro-LED in FIG. 1 according to a second embodiment of this invention.

FIG. 5A is an enlarged cross-sectional view of the micro-LED 100A according to a second embodiment of this invention. Referring now to FIG. 5A, the first type semiconductor layer 122 and the second type semiconductor layer 124 form a first p-n junction, the edge isolation structure 130a and the first type semiconductor layer 122 form a second p-n junction, and the first conductive layer 140 and the second conductive layer 150 are configured to forward bias the first p-n junction while reverse bias the second p-n junction. In an embodiment, the first type semiconductor layer 122 is a p type semiconductor layer, and the second type semiconductor layer 124 and the edge isolation structure 130a are n type semiconductor layers. In another embodiment, the first type semiconductor layer 122 is an n type semiconductor layer, and the second type semiconductor layer 124 and the edge isolation structure 130a are p type semiconductor layers. As a result, no current will flow through the part of the active layer 123 corresponding to the edge isolation structure 130a, so that the edge isolation structure 130a can isolate current into the edge of the micro-LED 100A and thus achieves the purpose of reducing surface recombination.

Other details regarding the micro-LED 100A of FIG. 5A are similar to the micro-LED 100A of FIG. 3 and therefore are not repeated here to avoid duplicity.

Figure 5B:
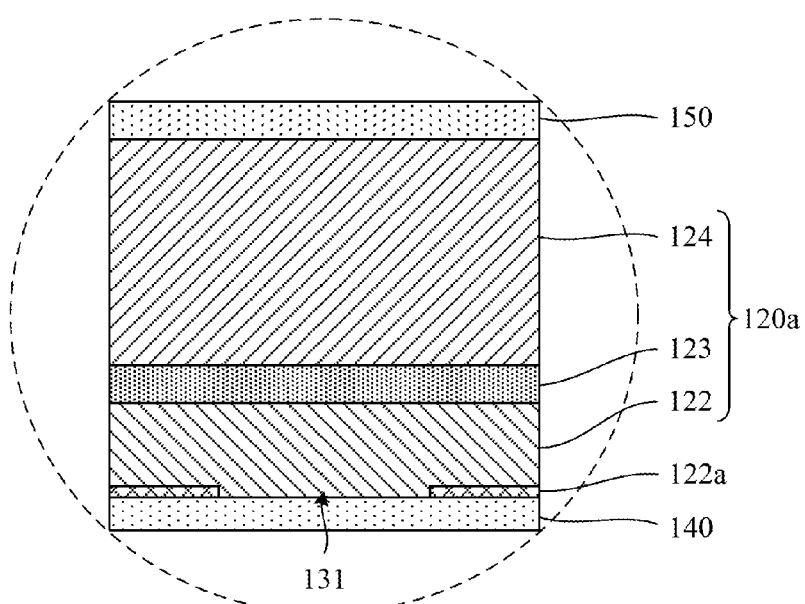
FIG. 5B is an enlarged cross-sectional view of the micro-LED in FIG. 1 according to a third embodiment of this invention.

FIG. 5B is an enlarged cross-sectional view of the micro-LED 100A according to still a third embodiment of this invention. Referring now to FIG. 5B, the first type semiconductor layer 122 and the second type semiconductor layer 124 form a p-n junction, the edge isolation structure 122a and the first type semiconductor layer 122 form a Schottky barrier. In the embodiments, the first type semiconductor layer 122 may consisted of heavily Mg-doped p-GaN (e.g., 30 nm in thickness and [Mg]=~2.2×10$^{20}$ cm-3) or moderately Mg-doped p-GaN (e.g., 120 nm in thickness and [Mg]=~2.1×10$^{19}$ cm-3), for example. To fabricate the edge isolation structure 122a, an Ar$^+$ plasma treatment on the first type semiconductor layer 122 was performed using a predetermined working pressure, rf power, and a predetermined process time. The Schottky barrier were first fabricated on the treated surfaces of the first type semiconductor layer 122 using an Ni/Ag/Pt ohmic contact as the first conductive layer 140. It is evident that the bias current of the Ni/Ag/Pt contact formed on the plasma-treated surfaces of the first type semiconductor layer 122 are nearly zero in the measured voltage range from −1 to 5V, while the plasma-untreated surfaces of the first type semiconductor layer 122 shows ohmic behavior. That is, the Ar$^+$ plasma treatment to the first type semiconductor layer 122 led to the formation of a large barrier height. As a result, no current will flow through the part of the active layer 123 corresponding to the edge isolation structure 122a, so that the edge isolation structure 122a can isolate current into the edge of the micro-LED 100A and thus achieves the purpose of reducing surface recombination.

Other details regarding the micro-LED 100A of FIG. 5B are similar to the micro-LED 100A of FIG. 3 and therefore are not repeated here to avoid duplicity.

In another embodiment, the first type semiconductor layer 122 has the resistivity $\rho_1$ mentioned above, the edge isolation structure layer 130 is a high resistivity layer which has a resistivity $\rho_h$, and $\rho_h > \rho_1$. For example, $\rho_h$ may be over 10 times greater than $\rho_1$, but the invention is not limited in this regard. In some embodiments, the edge isolation structure layer 130 can be a semiconductor layer doped with a lower concentration with respect to the first type semiconductor layer 122, a semi-metal layer, a ceramic layer, or a semi-insulator layer. As a result, the edge isolation structure layer 130 can lead most of the current to flow through the passage 131 of the edge isolation structure layer 130, so as to limit the emitting area of the active layer 123 at a part corresponding to the passage 131 as possible. For example, under the circumstances that the resistivity $\rho_h$ of the edge isolation structure layer 130 is 10 times greater than the resistivity $\rho_1$ of the first type semiconductor layer 122, at least 50% current will flow through the passage 131 having relatively small area, so that the edge isolation structure layer 130 can achieve the purpose of reducing surface recombination.

In some embodiments, as shown in FIG. 5B, the first type semiconductor layer 122 is a p type semiconductor layer, the second type semiconductor layer 124 is an n type semiconductor layer, and the edge isolation structure 130 is a hole blocking layer. The LUMO (Lowest Unoccupied Molecular Orbital) energy level of the edge isolation structure 130 is lower than that of the first type semiconductor layer 122 for at least 0.2 eV, so as to block holes transporting from the first type semiconductor layer 122 to the active layer 123. As a result, the holes in the first type semiconductor layer 122 can only transport to the active layer 123 via the passage 131 of the edge isolation structure 130. For example, the material of the edge isolation structure 130 can be $Al_xGa_yN_{(1-x-y)}$ with superlattice structure.

In some embodiments, as shown in FIG. 5B, the first type semiconductor layer 122 is an n type semiconductor layer, the second type semiconductor layer 124 is a p type semiconductor layer, and the edge isolation structure 130 is an electron blocking layer. The HOMO (Highest Occupied Molecular Orbital/Conduction band) energy level of the edge isolation structure 130 is higher than that of the first type semiconductor layer 122 for at least 0.2 eV, so as to block electrons transporting from the first type semiconductor layer 122 to the active layer 123. As a result, the electrons in the first type semiconductor layer 122 can only transport to the active layer 123 via the passage 131 of the edge isolation structure 130. For example, the material of the edge isolation structure 130 can be $Al_xGa_yN_{(1-x-y)}$ with superlattice structure.

Referring back to FIG. 1 and FIG. 3, in the embodiment, the edge isolation structure 130 is located at a side of the micro p-n diodes 120a proximal to the bonding electrode 310 of the receiving substrate 300. That is, the passage 131 of the edge isolation structure 130 faces toward the receiving substrate 300. However, the invention is not limited in this regard.

Figure 6A:
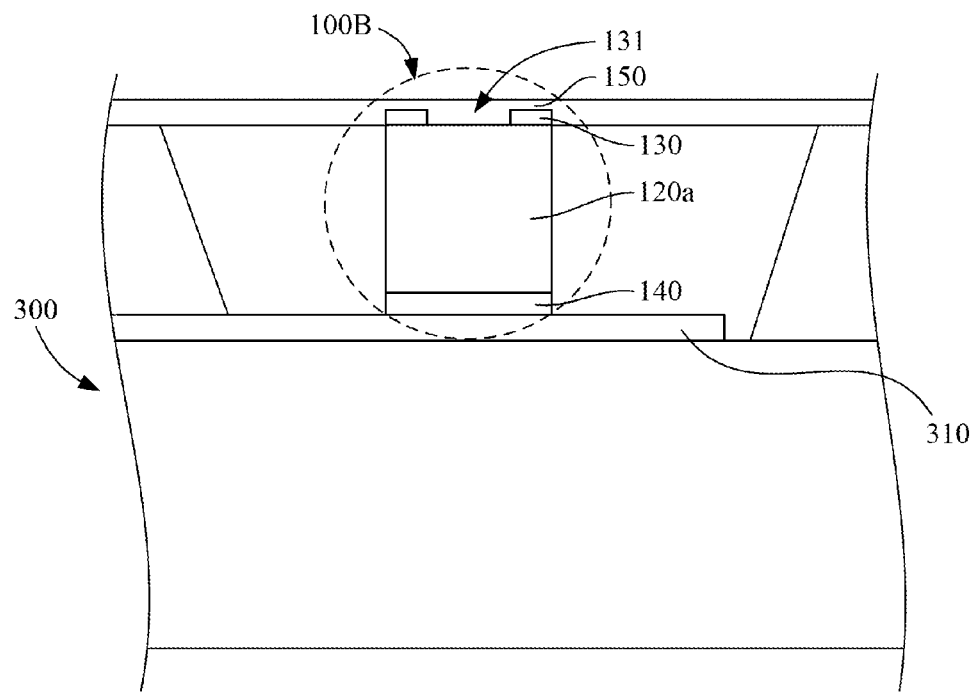
FIG. 6A is a cross-sectional view of a micro-LED disposed on a receiving substrate according to an embodiment of this invention.
Figure 6B:
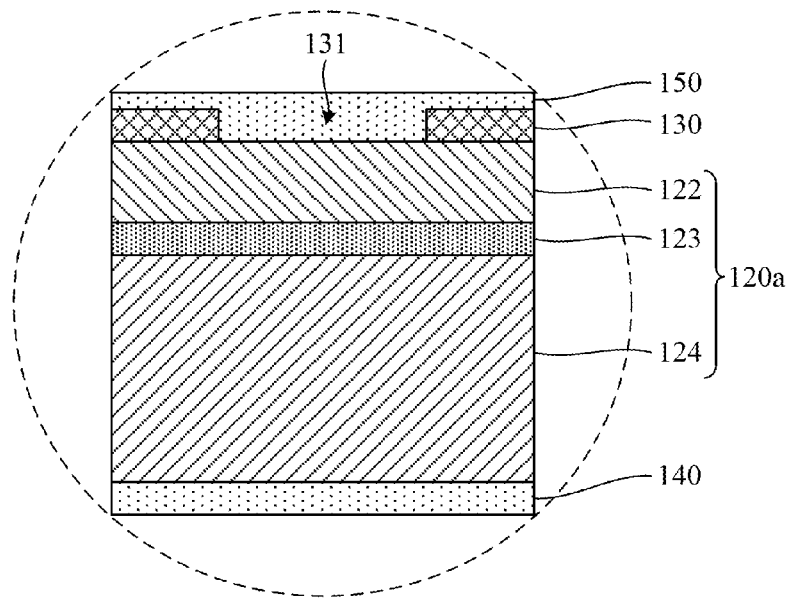
FIG. 6B is an enlarged cross-sectional view of the micro-LED in FIG. 6A according to an embodiment of this invention.

FIG. 6A is a cross-sectional view of a micro-LED 100B disposed on a receiving substrate 300 according to an embodiment of this invention. FIG. 6B is an enlarged cross-sectional view of the micro-LED 100B in FIG. 6A according to an embodiment of this invention. The micro-LED 100B also includes a micro p-n diodes 120a, an edge isolation structure 130, a first conductive layer 140, and a second conductive layer 150. A combination of the first type semiconductor layer 122, the active layer 123, the second type semiconductor layer 124, the edge isolation structure 130, the first conductive layer 140, and the second conductive layer 150 is joined with the bonding electrode 310 on the receiving substrate 300, so as to form a micro-LED display. The difference between the micro-LED 100B of FIG. 6A and the micro-LED 100A of FIG. 3 is that the edge isolation structure 130 of FIG. 6A is located at a side of the micro p-n diodes 120a distal to the bonding electrode 310 of the receiving substrate 300, and the second conductive layer 150 is wholly transparent. That is, the passage 131 of the edge isolation structure 130 of FIG. 6A faces away from the receiving substrate 300.

To manufacture the micro-LED 100B shown in FIGS. 6A & 6B, a semiconductor device layer 120 and a patterned edge isolation structure 130 can be sequentially formed on a growth substrate 110 (as illustrated in FIG. 2C). A difference between the manufacturing of the micro-LED 100B of FIG. 6A and the micro-LED 100A of FIG. 1 is that the formation of the first conductive layer 140 of micro-LED 100B is performed after bonding the structure of FIG. 2C to the structure of FIG. 2E (as the operation illustrated in FIG. 2F) and removing the growth substrate 110. After forming the first conductive layer 140 on the thinned p-n diode layer 120, the combination of the first conductive layer 140, the thinned p-n diode layer 120, and the edge isolation structure 130 is etched to form a plurality of micro p-n diodes 120a (as the operation illustrated in FIG. 2H). Alternatively, in some embodiments, the first conductive layer 140 is formed on the receiving substrate 300 in advance, rather than formed on the thinned p-n diode layer 120. In some embodiments, the first conductive layer 140 can be omitted, and the p-n diode layer 120 can be directly joined with the bonding electrode 310 on the receiving substrate 300.

Afterwards, to make the passage 131 of the edge isolation structure 130 of FIG. 6A face away from the receiving substrate 300, the micro p-n diodes 120a can be transferred to another carrier substrate 200 to reverse the orientation of the micro p-n diodes 120a prior to transferring the micro p-n diodes 120a to the receiving substrate 300 (as the operation illustrated in FIG. 2I). After bonding the micro p-n diodes 120a to the later carrier substrate 200, the adhesion force of the adhesive layer 210 on the former carrier substrate 200 is decreased, so as to separate the micro p-n diodes 120a from the former carrier substrate 200. Alternatively, in some embodiments, the micro p-n diodes 120a can be picked up twice sequentially by two transfer heads to reverse the orientation of the micro p-n diodes 120a prior to transferring the micro p-n diodes 120a to the receiving substrate 300.

It is noted that the edge isolation structure 130 of FIG. 6B can wholly isolate between the edge of the first type semiconductor layer 122 and the second conductive layer 150 (as illustrated in FIG. 4A), or partially isolate between the edge of the first type semiconductor layer 122 and the second conductive layer 150 (as illustrated in FIG. 4C). Under the configurations, charge carriers spreading to the side surface of the micro-LED 100B are rare or none. Therefore, the non-radiative recombination occurring at the side surface of the micro-LED 100B can be reduced, thereby increasing the efficiency of the micro-LED 100B.

Other details regarding the micro-LED 100B of FIG. 6B are similar to the micro-LED 100A of FIG. 3 and therefore are not repeated here to avoid duplicity.

Figure 6C:
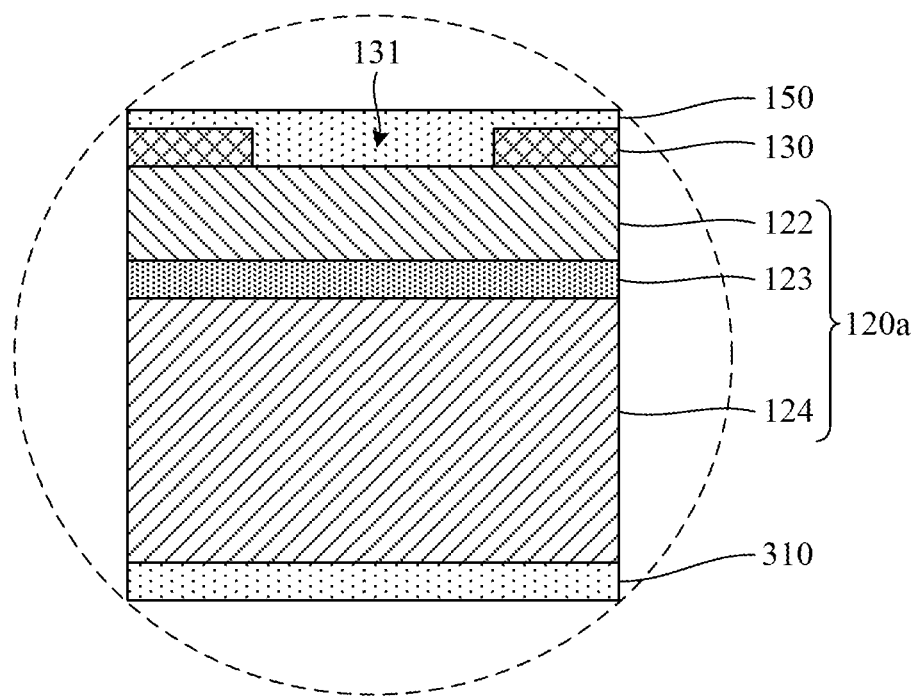
FIG. 6C is an enlarged cross-sectional view of the micro-LED in FIG. 6A according to an embodiment of this invention.

FIG. 6C is an enlarged cross-sectional view of the micro-LED 100B in FIG. 6A according to an embodiment of this invention. A difference between the manufacturing of the micro-LED 100B of FIG. 6C and the micro-LED 100B of FIG. 6A is that the operation of forming the first conductive layer 140 can be omitted in the micro-LED 100C of FIG. 6A, and the combination of first type semiconductor layer 122, the active layer 123, the second type semiconductor layer 124, and the edge isolation structure 130 can be directly bonded to the bonding electrode 310 of the receiving substrate 300. In other words, the bonding electrode 310 can serve as the first conductive layer 140 of the micro-LED 100B of FIG. 6A.

Other details regarding the micro-LED 100B of FIG. 6C are similar to the micro-LED 100B of FIG. 6A and therefore are not repeated here to avoid duplicity.

Figure 7A:
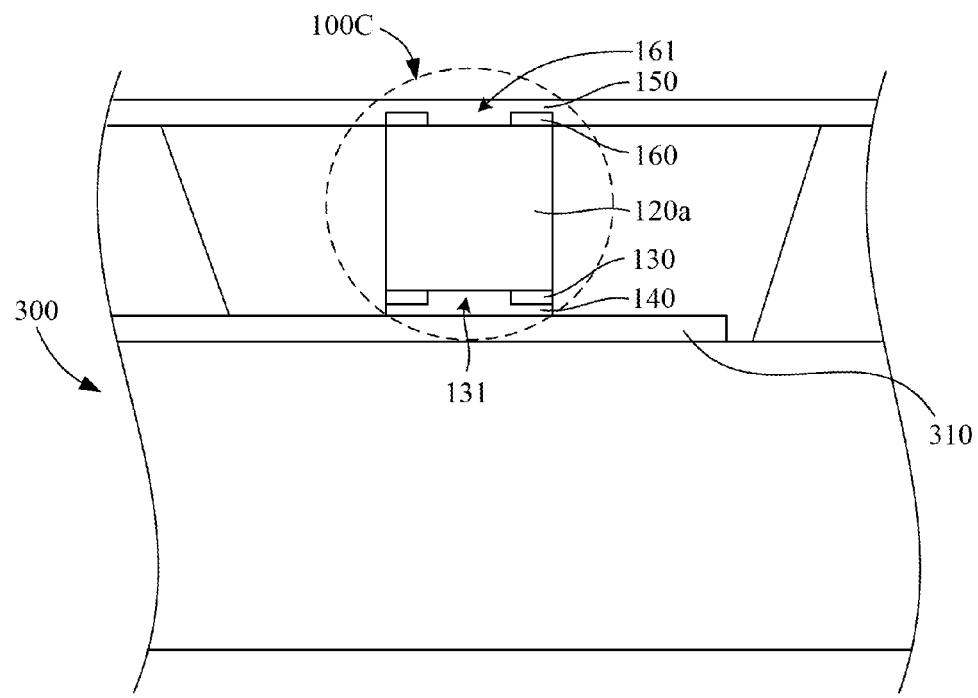
FIG. 7A is a cross-sectional view of a micro-LED disposed on a receiving substrate according to an embodiment of this invention.
Figure 7B:
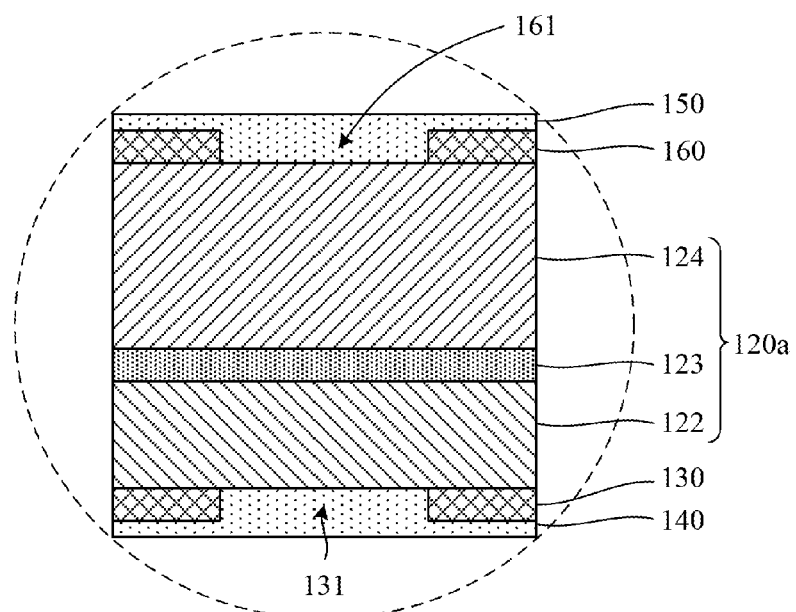
FIG. 7B is an enlarged cross-sectional view of the micro-LED in FIG. 7A according to an embodiment of this invention.

FIG. 7A is a cross-sectional view of a micro-LED 100C disposed on a receiving substrate 300 according to an embodiment of this invention. FIG. 7B is an enlarged cross-sectional view of the micro-LED 100C in FIG. 7A according to an embodiment of this invention. The micro-LED 100C also includes a micro p-n diodes 120a, an edge isolation structure 130, a first conductive layer 140, and a second conductive layer 150, and further includes another edge isolation structure 160. The difference between the micro-LED 100C of FIG. 7A and the micro-LED 100A of FIG. 1 is that the micro-LED 100C further includes the edge isolation structure 160 located at a side of the micro p-n diodes 120a distal to the bonding electrode 310 of the receiving substrate 300, in which the second conductive layer 150 extends through at least one passage 161 of the edge isolation structure 160 formed between the second type semiconductor layer 124 and the second conductive layer 150 to be electrically coupled with the second type semiconductor layer 124. That is, the passage 161 of the edge isolation structure 160 of FIG. 7A faces away from the receiving substrate 300.

To manufacture the micro-LED 100C shown in FIGS. 7A & 7B, operations illustrated by FIG. 2A-2G can be sequentially performed. A difference between the manufacturing of the micro-LED 100C of FIG. 7A and the micro-LED 100A of FIG. 1 is that the formation of the edge isolation structure 160 is performed after removing the growth substrate 110. After forming the edge isolation structure 160 on the thinned p-n diode layer 120, the combination of the edge isolation structure 160, the thinned p-n diode layer 120, the edge isolation structure 130, and the first conductive layer 140 is etched to form a plurality of micro p-n diodes 120a (as the operation illustrated in FIG. 2H). Afterwards, the micro p-n diodes 120a are poised for pick up and transfer to the receiving substrate 300 (as the operation illustrated in FIG. 2I).

It is noted that the edge isolation structure 130 of FIG. 7B can wholly isolate between the edge of the first type semiconductor layer 122 and the first conductive layer 140 (as illustrated in FIG. 4A), or partially isolate between the edge of the first type semiconductor layer 122 and the first conductive layer 140 (as illustrated in FIG. 4C). Similarly, the edge isolation structure 160 of FIG. 7B can wholly isolate between the edge of the second type semiconductor layer 124 and the second conductive layer 150 (as illustrated in FIG. 4A), or partially isolate between the edge of the second type semiconductor layer 124 and the second conductive layer 150 (as illustrated in FIG. 4C). Under the configurations, charge carriers spreading to the side surface of the micro-LED 100C are rare or none. Therefore, the non-radiative recombination occurring at the side surface of the micro-LED 100C can be reduced, thereby increasing the efficiency of the micro-LED 100C.

Other details regarding the micro-LED 100C of FIG. 7B are similar to the micro-LED 100A of FIG. 3 and therefore are not repeated here to avoid duplicity.

Figure 8:
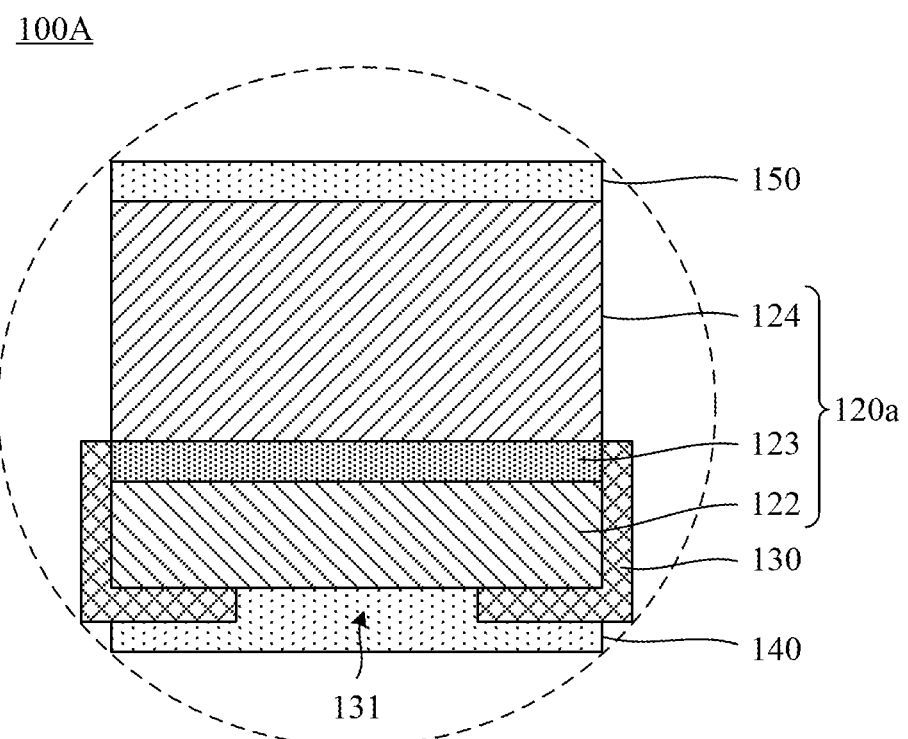
FIG. 8 is an enlarged cross-sectional view of a micro-LED according to another embodiment of this invention.

FIG. 8 is an enlarged cross-sectional view of a micro-LED 100A according to another embodiment of this invention. Similar to the edge isolation structure 130 in FIG. 3, the edge isolation structure 130 of FIG. 8 partially cover a major surface of the first type semiconductor layer 122 distal to the second type semiconductor layer 124. The difference between the edge isolation structure 130 of FIG. 8 and the edge isolation structure 130 of FIG. 3 is that the edge isolation structure 130 of FIG. 8 further at least partially covers the side surfaces of the first type semiconductor layer 122 and the active layer 123, and the edge isolation structure 130 must be a dielectric layer. In this configuration, the side surfaces of the first type semiconductor layer 122 and the active layer 123 can be protected from moisture, process contamination, and mechanical damage by the edge isolation structure 130. It is noted that all embodiments of the edge isolation structure described above (i.e., the edge isolation structures 130, 130a, and 122a) can be applied if the edge isolation structure only partially covers the side surface of the first type semiconductor layer 122 without the side surface of the active layer 123.

Other details regarding the micro-LED 100A of FIG. 8 are similar to the micro-LED 100A of FIG. 3 and therefore are not repeated here to avoid duplicity.

Figure 9A:
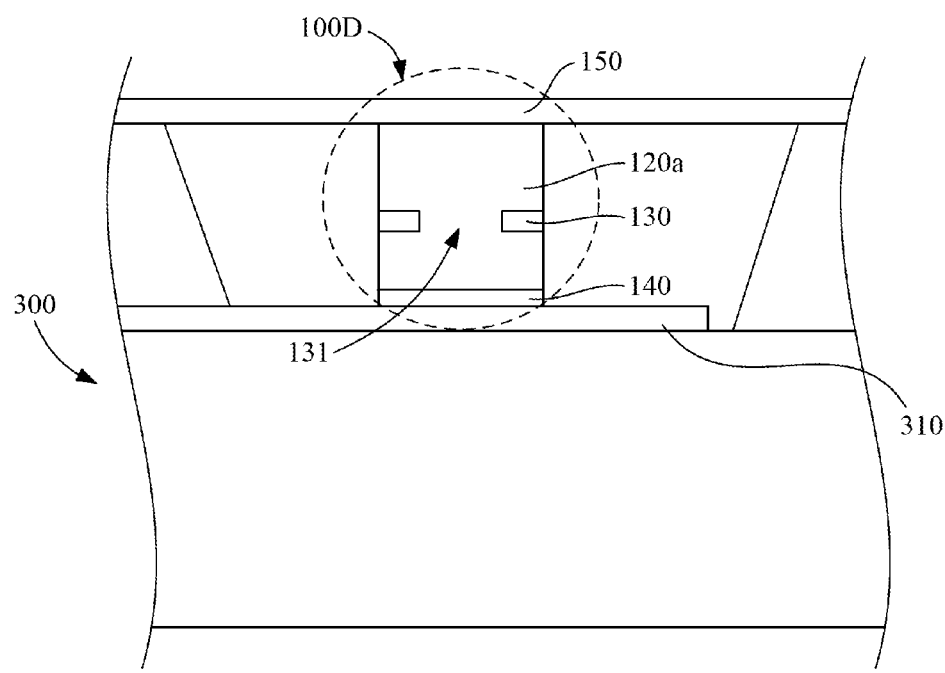
FIG. 9A is a cross-sectional view of a micro-LED disposed on a receiving substrate according to an embodiment of this invention.
Figure 9B:
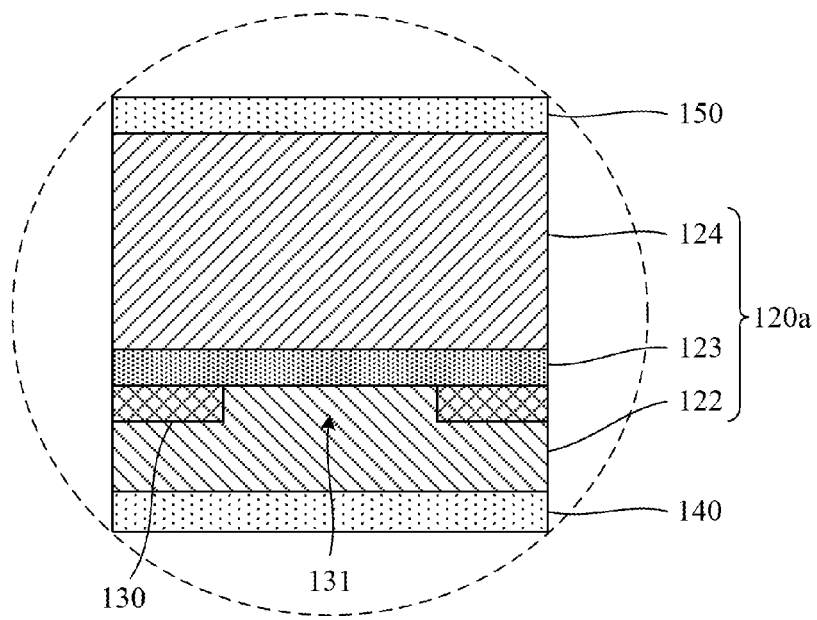
FIG. 9B is an enlarged cross-sectional view of the micro-LED in FIG. 9A according to an embodiment of this invention.

FIG. 9A is a cross-sectional view of a micro-LED 100D disposed on a receiving substrate 300 according to an embodiment of this invention. FIG. 9B is an enlarged cross-sectional view of the micro-LED 100D in FIG. 9A according to an embodiment of this invention. The micro-LED 100D includes a micro p-n diode 120a, a edge isolation structure 130 disposed in the micro p-n diode 120a, a first conductive layer 140, and a second conductive layer 150. The micro p-n diode 120a includes a first type semiconductor layer 122, an active layer 123, and a second type semiconductor layer 124. The first type semiconductor layer 122 is a p type semiconductor layer, and the second type semiconductor layer 124 is an n type semiconductor layer. The second type semiconductor layer 124 is joined with the first type semiconductor layer 122. The active layer 123 is disposed between the first type semiconductor layer 122 and the second type semiconductor layer 124. The edge isolation structure 130 is disposed between the first type semiconductor layer 122 and the active layer 123 and has at least one passage 131, and the first type semiconductor layer 122 is electrically coupled with the active layer 123 through the passage 131 of the edge isolation structure 130. The first conductive layer 140 is electrically coupled with the first type semiconductor layer 122. The second conductive layer 150 is electrically coupled with the second type semiconductor layer 124. In some embodiments, the first conductive layer 140 can be omitted, and the micro p-n diode 120*a* can be directly joined with the bonding electrode 310 on the receiving substrate 300.

It is noted that the difference between the edge isolation structure 130 of FIG. 9B and the edge isolation structure 130 of FIG. 1 is that the edge isolation structure 130 of FIG. 9B is disposed between the first type semiconductor layer 122 and the active layer 123, and the edge isolation structure 130 contacts the active layer 123. To manufacture the micro-LED 100D shown in FIG. 9B in which the edge isolation structure 130 is disposed between the first type semiconductor layer 122 and the active layer 123, the formation of the edge isolation structure 130 illustrated in FIGS. 2A & 2C can be brought forward to be performed after the formation of the active layer 123 and before the formation of the first type semiconductor layer 122 illustrated in FIG. 2B.

Figure 9C:
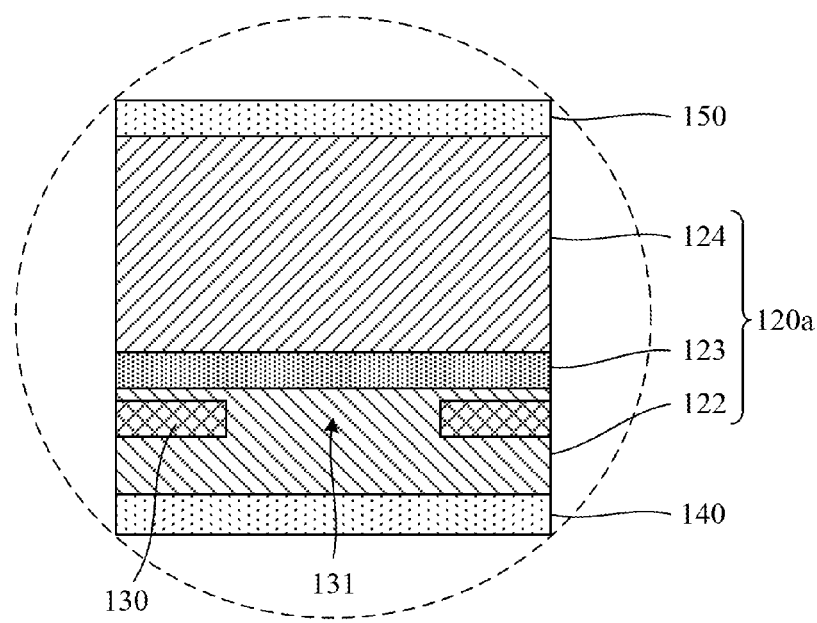
FIG. 9C is an enlarged cross-sectional view of the micro-LED in FIG. 9A according to another embodiment of this invention.

FIG. 9C is an enlarged cross-sectional view of the micro-LED 100D in FIG. 9A according to another embodiment of this invention. The difference between the edge isolation structure 130 of FIG. 9C and the edge isolation structure 130 of FIG. 9B is that the edge isolation structure 130 of FIG. 9C is disposed in the first type semiconductor layer 122 without contacting the active layer 123. In this configuration, the first type semiconductor layer 122 may protect the active layer 123 while manufacturing the edge isolation structure 130.

To manufacture the micro-LED 100D shown in FIG. 9C in which the edge isolation structure 130 is disposed in the first type semiconductor layer 122, the formation of the edge isolation structure 130 illustrated in FIGS. 2A & 2C can be brought forward to be performed during the formation of the first type semiconductor layer 122 illustrated in FIG. 2B. For example, the edge isolation structure 130 can be formed after forming 10% of the first type semiconductor layer 122, and the rest 90% of the first type semiconductor layer 122 is then formed after the formation of the edge isolation structure 130.

Other details regarding the micro-LED 100D of FIG. 9C are similar to the micro-LED 100D of FIG. 9B and therefore are not repeated here to avoid duplicity.

Figure 9D:
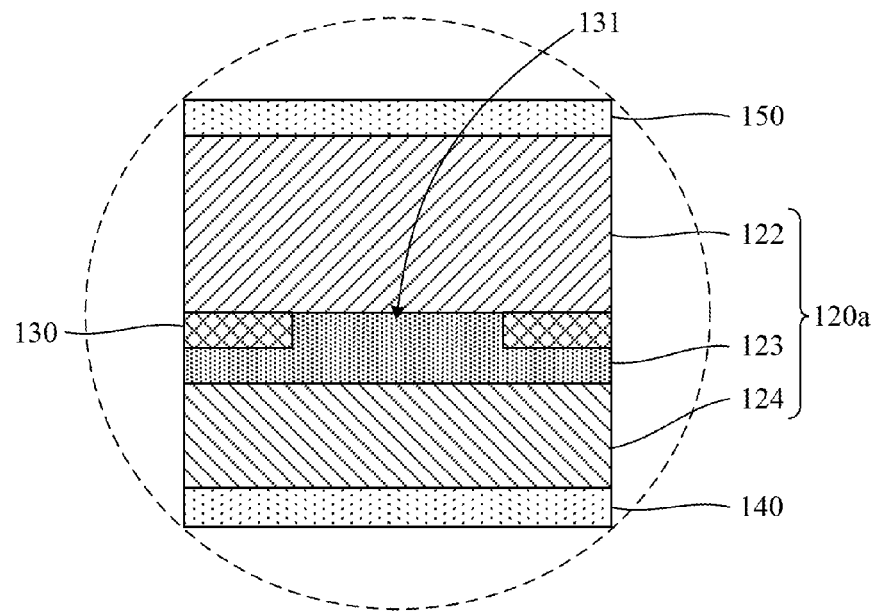
FIG. 9D is an enlarged cross-sectional view of the micro-LED in FIG. 9A according to another embodiment of this invention.

FIG. 9D is an enlarged cross-sectional view of the micro-LED 100D in FIG. 9A according to an embodiment of this invention. The differences between the edge isolation structure 130 of FIG. 9D and the edge isolation structure 130 of FIG. 1 are that the edge isolation structure 130 of FIG. 9D is disposed between the first type semiconductor layer 122 and the active layer 123, the edge isolation structure 130 contacts the active layer 123, the first type semiconductor layer 122 is an n type semiconductor layer, and the second type semiconductor layer 124 is a p type semiconductor layer. To manufacture the micro-LED 100D shown in FIG. 9D in which the edge isolation structure 130 is disposed between the first type semiconductor layer 122 and the active layer 123, the formation of the edge isolation structure 130 illustrated in FIGS. 2A & 2C can be brought forward to be performed before the formation of the active layer 123 illustrated in FIG. 2B.

In the embodiment, after the patterned edge isolation structure 130 is formed on the first type semiconductor layer 122, the active layer 123 is formed from the passage 131 of the edge isolation structure 130, but the invention is not limited in this regard. In some embodiments, after the patterned edge isolation structure 130 is formed on the first type semiconductor layer 122, the passage 131 of the edge isolation structure 130 can be further filled with first type semiconductor layer 122.

Other details regarding the micro-LED 100D of FIG. 9D are similar to the micro-LED 100D of FIG. 9B and therefore are not repeated here to avoid duplicity.

Figure 9E:
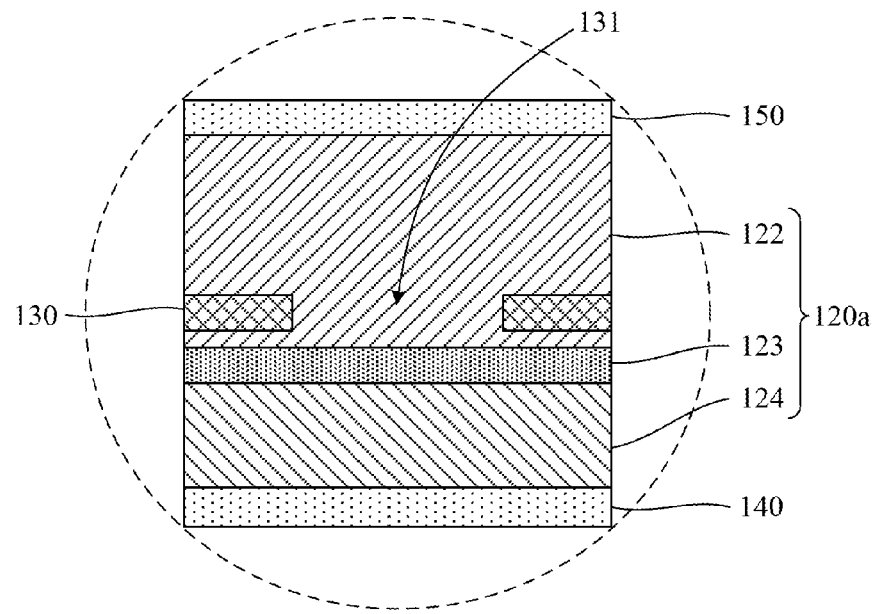
FIG. 9E is an enlarged cross-sectional view of the micro-LED in FIG. 9A according to another embodiment of this invention.

FIG. 9E is an enlarged cross-sectional view of the micro-LED 100D in FIG. 9A according to another embodiment of this invention. The difference between the edge isolation structure 130 of FIG. 9E and the edge isolation structure 130 of FIG. 9D is that the edge isolation structure 130 of FIG. 9E is disposed in the first type semiconductor layer 122 without contacting the active layer 123.

To manufacture the micro-LED 100D shown in FIG. 9E in which the edge isolation structure 130 is disposed in the first type semiconductor layer 122, the formation of the edge isolation structure 130 illustrated in FIGS. 2A & 2C can be brought forward to be performed during the formation of the first type semiconductor layer 122 illustrated in FIG. 2B. For example, the edge isolation structure 130 can be formed after forming 90% of the first type semiconductor layer 122, and the rest 10% of the first type semiconductor layer 122 is then formed after the formation of the edge isolation structure 130.

Other details regarding the micro-LED 100D of FIG. 9E are similar to the micro-LED 100D of FIG. 9D and therefore are not repeated here to avoid duplicity.

Figure 9F:
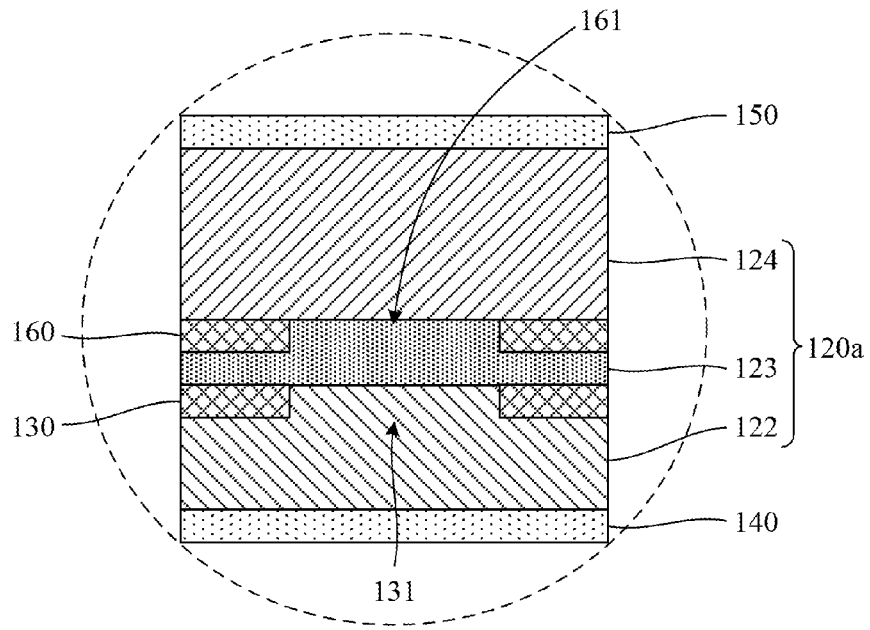
FIG. 9F is an enlarged cross-sectional view of the micro-LED in FIG. 9A according to another embodiment of this invention.

FIG. 9F is an enlarged cross-sectional view of the micro-LED 100D in FIG. 9A according to an embodiment of this invention. The difference between the micro-LED 100D of FIG. 9F and the micro-LED 100D of FIG. 9B is that the micro-LED 100D of FIG. 9F further includes a edge isolation structure 160. The edge isolation structure 160 is disposed between the active layer 123 and the second type semiconductor layer 124. That is, the edge isolation structures 130 and 160 are respectively located at opposite sides of the active layer 123. To manufacture the micro-LED 100D shown in FIG. 9F in which the edge isolation structure 130 is disposed between the first type semiconductor layer 122 and the active layer 123 and edge isolation structure 160 is disposed between the second type semiconductor layer 124 and the active layer 123, the formation of the edge isolation structure 160 can be performed after the formation of the second type semiconductor layer 124 and before the formation of the active layer 123 illustrated in FIG. 2B, and the formation of the edge isolation structure 130 illustrated in FIGS. 2A & 2C can be brought forward to be performed after the formation of the active layer 123 and before the formation of the first type semiconductor layer 122 illustrated in FIG. 2B. Similarly, in some embodiments, the passage 161 of the edge isolation structure 160 can be filled with the active layer 123 or the second type semiconductor layer 124.

Other details regarding the micro-LED 100D of FIG. 9F are similar to the micro-LED 100D of FIG. 9B and therefore are not repeated here to avoid duplicity.

Figure 9G:
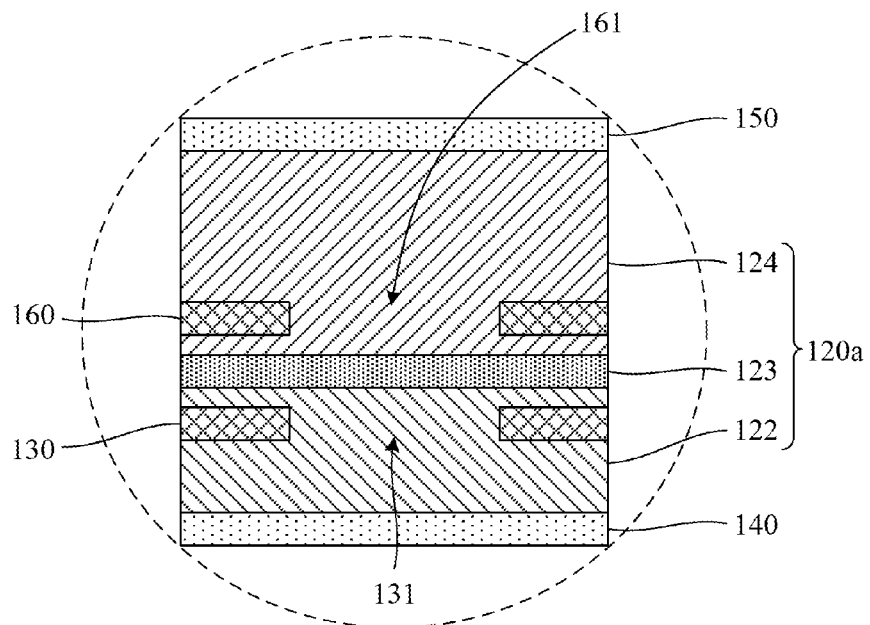
FIG. 9G is an enlarged cross-sectional view of the micro-LED in FIG. 9A according to another embodiment of this invention.

FIG. 9G is an enlarged cross-sectional view of the micro-LED 100D in FIG. 9A according to another embodiment of this invention. The differences between the edge isolation structures 130 and 160 of FIG. 9G and the edge isolation structures 130 and 160 of FIG. 9F are that the edge isolation structure 130 of FIG. 9G is disposed in the first type semiconductor layer 122 without contacting the active layer 123 and the edge isolation structure 160 of FIG. 9G is disposed in the second type semiconductor layer 124 without contacting the active layer 123. In this configuration, the first type semiconductor layer 122 may protect the active layer 123 while manufacturing the edge isolation structure 130.

In some embodiments, only one of the edge isolation structures 130 and 160 is formed to contact the active layer 123, and the other one of the edge isolation structures 130 and 160 is formed without contacting the active layer 123.

To manufacture the micro-LED 100D shown in FIG. 9G in which the edge isolation structure 130 is disposed in the first type semiconductor layer 122 and the edge isolation structure 160 is disposed in the second type semiconductor layer 124, the formation of the edge isolation structure 160 can be performed during the formation of the second type semiconductor layer 124 illustrated in FIG. 2B, and the formation of the edge isolation structure 130 illustrated in FIGS. 2A & 2C can be brought forward to be performed during the formation of the first type semiconductor layer 122 illustrated in FIG. 2B. For example, the edge isolation structure 160 can be formed after forming 90% of the second type semiconductor layer 124, and the rest 10% of the second type semiconductor layer 124 is then formed after the formation of the edge isolation structure 160. For example, the edge isolation structure 130 can be formed after forming 10% of the first type semiconductor layer 122, and the rest 90% of the first type semiconductor layer 122 is then formed after the formation of the edge isolation structure 130.

Other details regarding the micro-LED 100D of FIG. 9G are similar to the micro-LED 100D of FIG. 9F and therefore are not repeated here to avoid duplicity.

In some embodiments, the edge isolation structure 130 is disposed in the micro p-n diode 120a (e.g., between at least a part of the first type semiconductor layer 122 and the active layer 123 as shown in FIG. 9F and FIG. 9G), and the edge isolation structure 160 is disposed outside the micro p-n diode 120a (e.g., between the second type semiconductor layer 124 and the second conductive layer 150 as shown in FIG. 5B). In some embodiments, the edge isolation structure 130 is disposed outside the micro p-n diode 120a (e.g., between the first type semiconductor layer 122 and the first conductive layer 140 as shown in FIG. 5B), and the edge isolation structure 160 is disposed in the micro p-n diode 120a (e.g., between at least a part of the second type semiconductor layer 124 and the active layer 123 as shown in FIG. 9F and FIG. 9G).

It is noted that in the micro-LEDs 100D of FIG. 9B to FIG. 9G, to achieve the purpose of reducing surface recombination, the edge isolation structure 130 is a dielectric layer in some embodiments, but the invention is not limited in this regard. In some embodiments, the first type semiconductor layer 122 and the second type semiconductor layer 124 form a first p-n junction, the edge isolation structure 130 and the first type semiconductor layer 122 form a second p-n junction, and the first conductive layer 140 and the second conductive layer 150 are configured to forward bias the first p-n junction while reverse bias the second p-n junction. In some embodiments, the first type semiconductor layer 122 and the second type semiconductor layer 124 form a p-n junction, and the edge isolation structure 130 and the first type semiconductor layer 122 form a Schottky barrier. In some embodiments, the first type semiconductor layer 122 has the resistivity $\rho_1$, the edge isolation structure 130 is a high resistivity layer which has a resistivity $\rho_h$, and $\rho_h > \rho_1$. In some embodiments, the first type semiconductor layer 122 is a p type semiconductor layer, the second type semiconductor layer 124 is an n type semiconductor layer, and the edge isolation structure 130 is a hole blocking layer. In some embodiments, the first type semiconductor layer 122 is an n type semiconductor layer, the second type semiconductor layer 124 is a p type semiconductor layer, and the edge isolation structure 130 is an electron blocking layer. The mechanism of leading current of the edge isolation structure 160 of FIG. 9F and FIG. 9G can be similar to one of the above embodiments of the edge isolation structure 130 and therefore are not repeated here to avoid duplicity.

Figure 10:
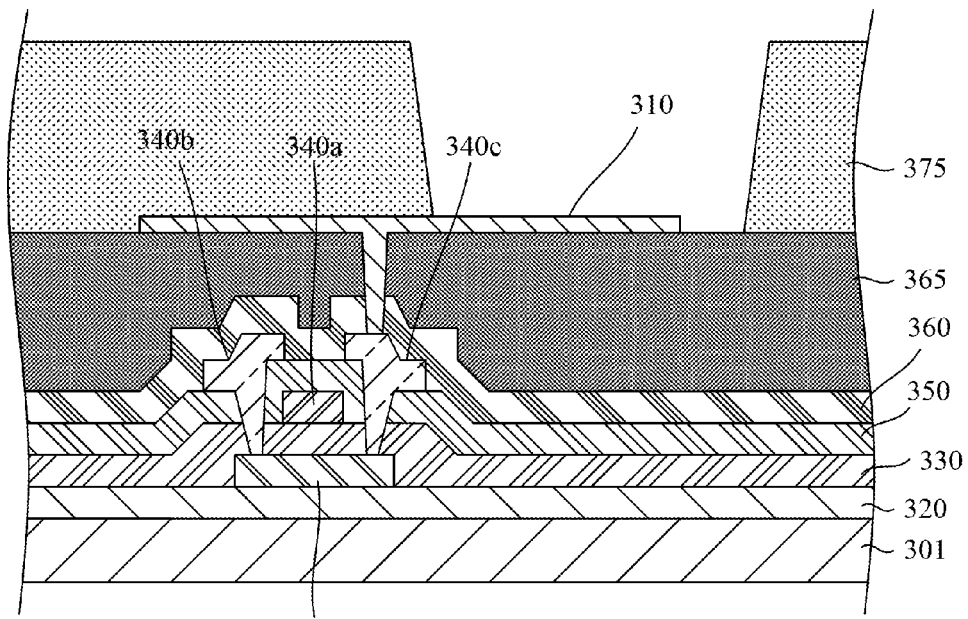
FIG. 10 is a cross-sectional views illustrating a receiving substrate according to an embodiment of the invention.

FIG. 10 is a cross-sectional view illustrating the receiving substrate 300 according to an embodiment of the invention. Referring to FIG. 10, a buffer layer 320 is formed on a substrate 301. A gate insulating layer 330 is formed on the entire surface of the substrate 301 having the semiconductor layer 325. A gate electrode 340a, an interlayer insulating layer 350, and source and drain electrodes 340b and 340c are formed on the gate insulating layer 330 to constitute a top gate structured thin film transistor (TFT). A passivation layer 360 and a planarization layer 365 are sequentially formed on or over an entire surface of the substrate 301, and a bonding electrode 310 is formed on the planarization layer 365 such that the bonding electrode 310 is electrically connected to the source or drain electrodes 340b and 340c by way of a via hole (not shown) formed through the passivation layer 360 and the planarization layer 365. A pixel defining layer 375 is then formed on or over the planarization layer 365 and/or a portion of the bonding electrode 310 to partially expose (or to expose a portion of) the bonding electrode 310.

Figure 11:
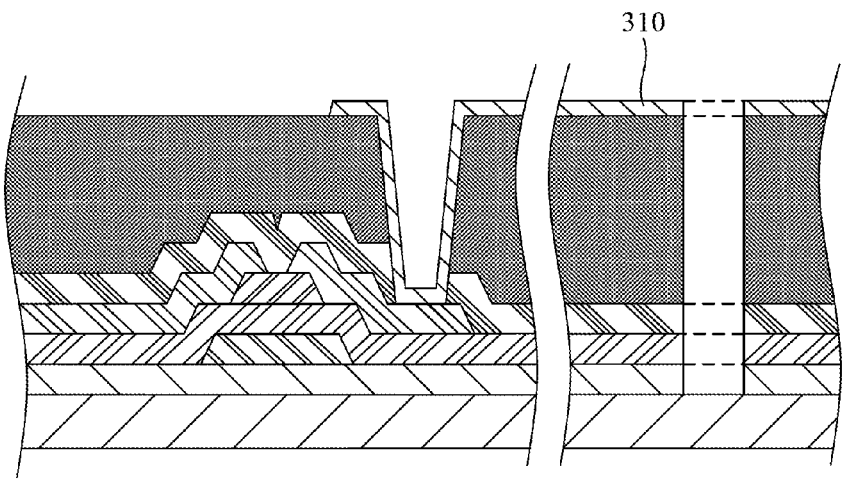
FIG. 11 is a cross-sectional view illustrating the receiving substrate according to another embodiment of the invention.

It is to be appreciated that the receiving substrate 300 with the top gate structured TFT illustrated in FIG. 10 is meant to be exemplary. FIG. 11 is a cross-sectional view illustrating the receiving substrate 300 according to another embodiment of the invention. Referring to FIG. 11, in the embodiment, the receiving substrate 300 is illustrated to include a bottom gate structured TFT, and the number of photomasks used to fabricate the receiving substrate 300 varies as needed. In some embodiments, a variety of suitable TFT of the receiving substrate 300 can be utilized in the invention.

Figure 12:
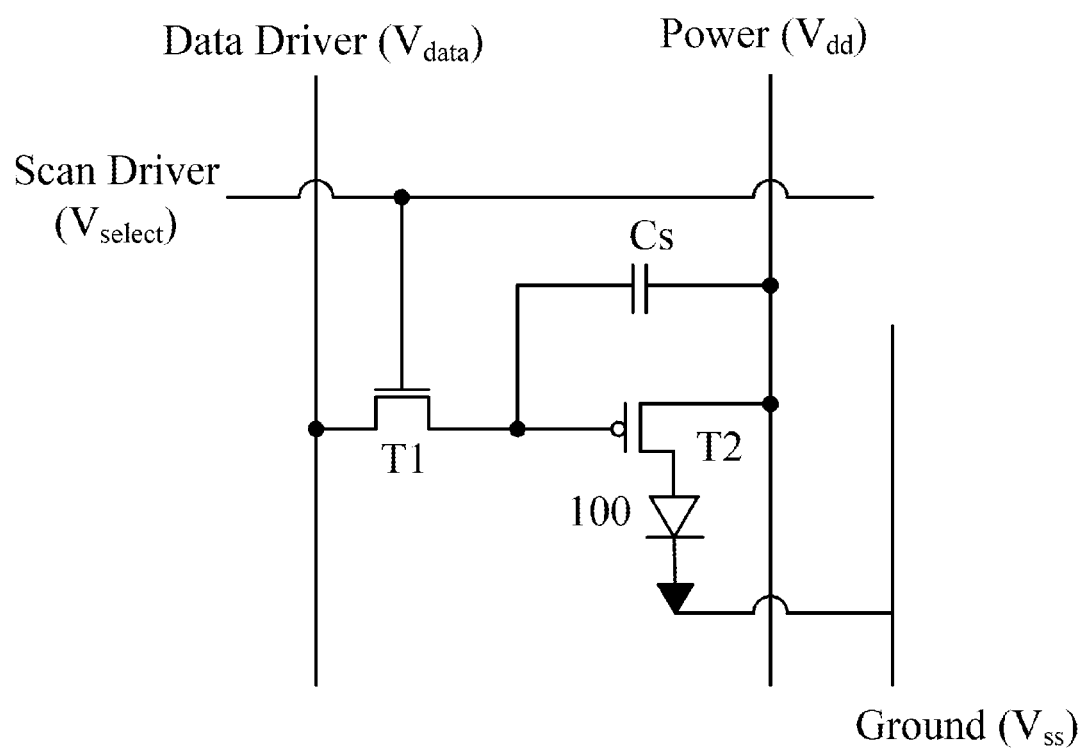
FIG. 12 is a circuit diagram of a subpixel with 2T1C circuitry in an active matrix display in accordance with an embodiment of the invention.

FIG. 12 is a circuit diagram of a subpixel with 2T1C circuitry according to an embodiment of the invention. In such an embodiment, the circuit can be used in the receiving substrate 300 illustrated in FIG. 10 or FIG. 11, which makes the receiving substrate 300 become an active matrix display substrate. The circuit includes a switching transistor T1, a driving transistor T2, a storage capacitor Cs, and a micro-LED 100. The transistors T1, T2 can be any type of transistor such as a thin film transistor. For example, the switching transistor T1 can be an n-type metal-oxide semiconductor (NMOS) transistor, and the driving transistor T2 can be a p-type metal-oxide semiconductor (PMOS) transistor. The switching transistor T1 has a gate electrode connected to a scan line $V_{select}$ and a first source/drain electrode connected to a data line $V_{data}$. The driving transistor T2 has a gate electrode connected to a second source/drain electrode of the switching transistor T1 and a first source/drain electrode connected to a power source $V_{dd}$. The storage capacitor Cs is connected between the gate electrode of the driving transistor T2 and the first source/drain electrode of the driving transistor T2. The micro-LED 100 has an anode electrode connected to a second source/drain electrode of the driving transistor T2 and a cathode electrode connected to a ground $V_{ss}$.

In operation, a voltage level scan signal turns on the switching transistor T1, which enables the data signal to charge the storage capacitor Cs. The voltage potential that stores within the storage capacitor Cs determines the magnitude of the current flowing through the driving transistor T2, so that the micro-LED 100 can emit light based on the current. It is to be appreciated that the 2T1C circuitry is meant to be exemplary, and that other types of circuitry or modifications of the traditional 2T1C circuitry are contemplated in accordance with embodiments of the invention. For example, more complicated circuits can be used to compensate for current distribution to the driver transistor and the micro device, or for their instabilities.

Figure 13:
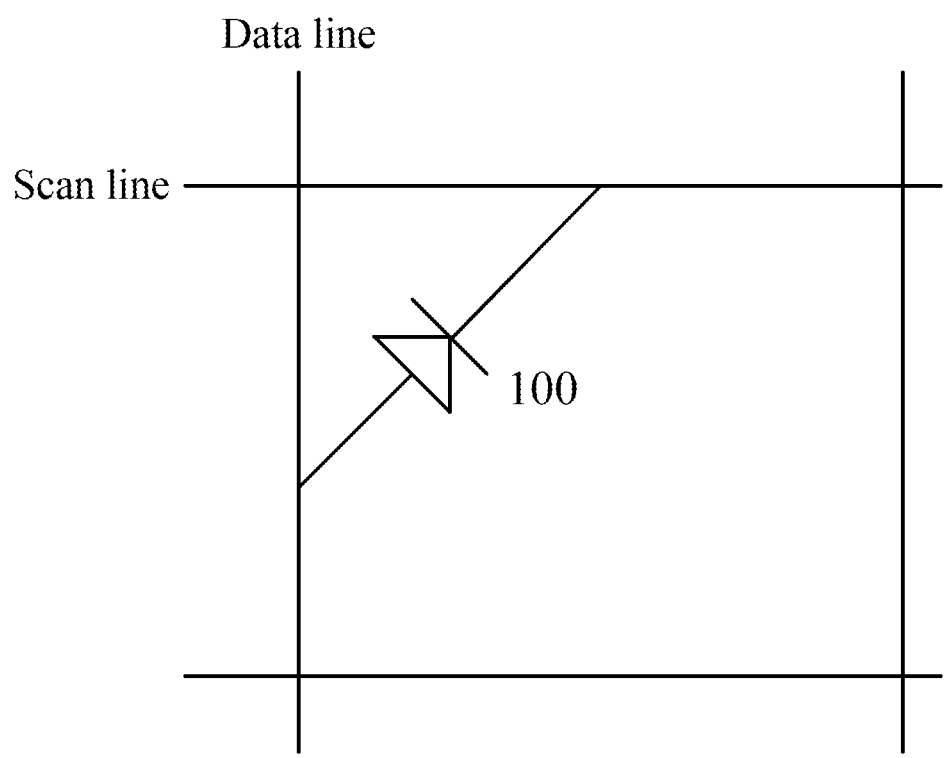
FIG. 13 is a circuit diagram of a subpixel according to an embodiment of the invention.

FIG. 13 is a circuit diagram of a subpixel according to an embodiment of the invention. In such an embodiment, the circuit used in the receiving substrate 300 makes the receiving substrate 300 become a passive matrix display substrate.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims is not intended to invoke the provisions of 35 U.S.C. §112, 6th paragraph.

What is claimed is:

1. A micro-light-emitting diode (micro-LED), comprising:
a first type semiconductor layer;
a second type semiconductor layer joined with the first type semiconductor layer;
a first edge isolation structure joined with the first type semiconductor layer;
a first electrode electrically coupled with the first type semiconductor layer, wherein at least a part of a vertical projection of an edge of the first type semiconductor layer on the first electrode overlaps with the first electrode, and the first edge isolation structure is at least partially located on the part of the first type semiconductor layer; and
a second electrode electrically coupled with the second type semiconductor layer, wherein at least one of the first electrode and the second electrode is at least partially transparent.

2. The micro-LED of claim 1, wherein the vertical projection of the edge of the first type semiconductor layer on the first electrode wholly overlaps with the first electrode, and the first edge isolation structure is at least partially located on the vertical projection of the first type semiconductor layer.

3. The micro-LED of claim 1, wherein the vertical projection of the edge of the first type semiconductor layer on the first electrode wholly overlaps with the first electrode, and the first edge isolation structure is wholly located on the vertical projection of the first type semiconductor layer.

4. The micro-LED of claim 1, wherein the first edge isolation structure is a dielectric layer.

5. The micro-LED of claim 1, wherein the first type semiconductor layer and the second type semiconductor layer form a first p-n junction, the first edge isolation structure and the first type semiconductor layer form a second p-n junction, and the first electrode and the second electrode are configured to forward bias the first p-n junction while reverse bias the second p-n junction.

6. The micro-LED of claim 1, wherein the first type semiconductor layer is a p type semiconductor layer, the second type semiconductor layer and the first edge isolation structure are n type semiconductor layers.

7. The micro-LED of claim 1, wherein the first type semiconductor layer is an n type semiconductor layer, the second type semiconductor layer and the first edge isolation structure are p type semiconductor layers.

8. The micro-LED of claim 1, wherein the first type semiconductor layer and the second type semiconductor layer form a p-n junction, the first edge isolation structure and the first type semiconductor layer form a Schottky barrier.

9. The micro-LED of claim 8, wherein the first edge isolation structure is a plasma-treated portion of the first type semiconductor layer.

10. The micro-LED of claim 1, wherein the first type semiconductor layer has a resistivity $\rho_1$, the first edge isolation structure is a high resistivity layer which has a resistivity $\rho_h$, and $\rho_h > \rho_1$.

11. The micro-LED of claim 1, wherein the first edge isolation structure is an electron blocking layer, and the first type semiconductor layer is an n type semiconductor layer.

12. The micro-LED of claim 1, wherein the first edge isolation structure is a hole blocking layer, and the first type semiconductor layer is a p type semiconductor layer.

13. A micro-LED display, comprising:
a substrate having a bonding electrode; and
at least one micro-LED of claim 1, wherein a combination of the first type semiconductor layer, the second type semiconductor layer, the first edge isolation structure, the first electrode, and the second electrode is joined with the bonding electrode, the first type semiconductor layer is proximal to the substrate, and the second type semiconductor layer is distal to the substrate.

14. A micro-LED display, comprising:
a substrate; and
at least one micro-LED of claim 1, wherein a combination of the first type semiconductor layer, the second type semiconductor layer, the first edge isolation structure, the first electrode, and the second electrode is joined with the substrate, the first type semiconductor layer is proximal to the substrate, the second type semiconductor layer is distal to the substrate, and the first electrode serves as a bonding electrode of the substrate.

15. A micro-LED display, comprising:
a substrate having a bonding electrode; and
at least one micro-LED of claim 1, wherein a combination of the first type semiconductor layer, the second type semiconductor layer, the first edge isolation structure, the first electrode, and the second electrode is joined with the bonding electrode, the first type semiconductor layer is distal to the substrate, and the second type semiconductor layer is proximal to the substrate.

16. A micro-LED display, comprising:
a substrate; and
at least one micro-LED of claim 1, wherein a combination of the first type semiconductor layer, the second type semiconductor layer, the first edge isolation structure, the first electrode, and the second electrode is joined with the substrate, the first type semiconductor layer is distal to the substrate, the second type semiconductor layer is proximal to the substrate, and the second electrode serves as a bonding electrode of the substrate.

17. The micro-LED of claim 1, wherein said one of the first electrode and the second electrode is wholly transparent.

18. The micro-LED of claim 1, wherein the first electrode is electrically coupled with the first type semiconductor layer through at least one passage of the first edge isolation structure formed between the first type semiconductor layer and the first electrode.

19. The micro-LED of claim 18, wherein the first type semiconductor layer has a resistivity $\rho_1$ and a thickness $t_1$, the second type semiconductor layer has a resistivity $\rho_2$ and a thickness $t_2$, and $$\sqrt{\frac{t_1}{\rho_1}} < \sqrt{\frac{t_2}{\rho_2}}.$$

20. The micro-LED of claim 18, further comprising:
a second edge isolation structure joined with the second type semiconductor layer, wherein the second electrode extends through at least one passage of the second edge isolation structure formed between the second type semiconductor layer and the second electrode to be electrically coupled with the second type semiconductor layer.

21. The micro-LED of claim 18, wherein the first electrode at least partially covers the exposed part of the first type semiconductor layer through the passage of the first edge isolation structure.

22. The micro-LED of claim 1, wherein the second electrode at least partially contacts the second type semiconductor layer.

23. The micro-LED of claim 1, wherein the first electrode at least partially contacts the first type semiconductor layer.

24. The micro-LED of claim 1, further comprising:
   an active layer disposed between the first type semiconductor layer and the second type semiconductor layer, wherein the first edge isolation structure is disposed between at least a part of the first type semiconductor layer and the active layer.

25. The micro-LED of claim 24, wherein the first edge isolation structure contacts the active layer.

26. The micro-LED of claim 24, wherein the first edge isolation structure is disposed in the first type semiconductor layer without contacting the active layer.

27. The micro-LED of claim 24, further comprising a second edge isolation structure disposed between at least a part of the second type semiconductor layer and the active layer.

28. The micro-LED of claim 24, further comprising:
   a second edge isolation structure joined with the second type semiconductor layer, wherein the second electrode extends through at least one passage of the second edge isolation structure formed between the second type semiconductor layer and the second electrode to be electrically coupled with the second type semiconductor layer.

29. The micro-LED of claim 1, wherein the passage of the first edge isolation structure is in the form of an opening.

* * * * *